(12) United States Patent
Wildman

(10) Patent No.: US 10,566,926 B2
(45) Date of Patent: Feb. 18, 2020

(54) SYSTEMS AND METHODS FOR COLLECTING SOLAR ENERGY USING A PARABOLIC TROUGH SOLAR COLLECTOR

(71) Applicant: Craig Bradley Edward Wildman, Kensington, CA (US)

(72) Inventor: Craig Bradley Edward Wildman, Kensington, CA (US)

(73) Assignee: Craig Bradley Edward Wildman, Kensington, CA (US)

( * ) Notice: Subject to any disclaimer, the term of this patent is extended or adjusted under 35 U.S.C. 154(b) by 38 days.

(21) Appl. No.: 15/405,136

(22) Filed: Jan. 12, 2017

(65) Prior Publication Data

US 2018/0115276 A1    Apr. 26, 2018

Related U.S. Application Data

(63) Continuation-in-part of application No. 15/374,669, filed on Dec. 9, 2016.
(60) Provisional application No. 62/412,839, filed on Oct. 26, 2016.

(51) Int. Cl.
*H02S 20/32* (2014.01)
*H02S 40/22* (2014.01)
(Continued)

(52) U.S. Cl.
CPC .............. *H02S 20/32* (2014.12); *F24S 23/71* (2018.05); *F24S 30/40* (2018.05); *F24S 50/20* (2018.05);
(Continued)

(58) Field of Classification Search
CPC .. F24S 23/71; F24S 23/74; F24S 20/20; F24S 30/40; F24S 2020/23; F24S 50/20;
(Continued)

(56) References Cited

U.S. PATENT DOCUMENTS 3,847,136 A * 11/1974 Salvail ................. F24S 30/425
126/592
3,986,921 A    10/1976 Putnam, Jr.
(Continued)

FOREIGN PATENT DOCUMENTS

CN        202393960      8/2012
EP        2161516 A1     3/2010
(Continued)

*Primary Examiner* — Lindsey A Bernier
(74) *Attorney, Agent, or Firm* — Kwan & Olynick LLP

(57) ABSTRACT

Various embodiments of the present disclosure relate to systems and processes for collecting solar energy. According to particular embodiments, a solar collector device comprises a primary reflector, and a receiver assembly mounted on a frame structure. The receiver assembly comprises a heat transfer tube. The primary reflector comprises an elongated curved mirror mounted on a structural backing that is rotatably coupled to the frame structure such that the primary reflector may pivot around a pivot axis. The receiver assembly and/or the primary reflector may translate along the frame structure in a direction that is parallel to the pivot axis of the primary reflector. The one or more primary reflectors reflect light focused upon the receiver assembly such that heat energy from the reflected light is transferred to a heat transfer fluid in the heat transfer tube.

20 Claims, 22 Drawing Sheets

(51) Int. Cl.
*H02S 40/44* (2014.01)
*F24S 50/20* (2018.01)
*H02S 20/10* (2014.01)
*H02S 20/30* (2014.01)
*H02S 30/10* (2014.01)
*F24S 30/40* (2018.01)
*F24S 23/71* (2018.01)
*F24S 20/00* (2018.01)

(52) U.S. Cl.
CPC .............. *H02S 20/10* (2014.12); *H02S 20/30* (2014.12); *H02S 30/10* (2014.12); *H02S 40/22* (2014.12); *H02S 40/44* (2014.12); *F24S 2020/17* (2018.05)

(58) Field of Classification Search
CPC .......... H02S 20/30; H02S 20/32; H02S 40/20; H02S 40/22; H02S 40/44; H02S 20/10; H02S 30/10; H02S 40/10; Y02E 10/52; Y02E 10/60
See application file for complete search history.

(56) References Cited

U.S. PATENT DOCUMENTS

| | | | |
|---|---|---|---|
| 4,209,222 A | 6/1980 | Posnansky | |
| 4,289,118 A * | 9/1981 | Stark | F24S 23/00 126/577 |
| 4,301,321 A | 11/1981 | Frederick | |
| 4,520,794 A | 6/1985 | Stark et al. | |
| 5,899,199 A | 5/1999 | Mills | |
| 6,131,565 A | 10/2000 | Mills | |
| 6,818,818 B2 | 11/2004 | Bareis | |
| 6,959,993 B2 | 11/2005 | Gross et al. | |
| 8,026,440 B1 | 9/2011 | Gordon | |
| 8,063,300 B2 | 11/2011 | Jorne et al. | |
| 8,153,886 B1 | 4/2012 | Garboushian et al. | |
| 8,247,685 B2 | 8/2012 | Hunter et al. | |
| 8,336,539 B2 | 12/2012 | Linderman et al. | |
| 8,546,681 B2 | 10/2013 | Wares et al. | |
| 8,604,404 B1 | 12/2013 | Linderman et al. | |
| 2010/0071683 A1 | 3/2010 | Selig et al. | |
| 2010/0218807 A1 | 9/2010 | Arbore et al. | |
| 2010/0319684 A1 | 12/2010 | Almogy et al. | |
| 2011/0017267 A1 | 1/2011 | Lichy et al. | |
| 2011/0180059 A1 | 7/2011 | Selig et al. | |
| 2011/0220094 A1 | 9/2011 | Mills et al. | |
| 2013/0112237 A1 | 5/2013 | Almogy et al. | |
| 2013/0239948 A1 | 9/2013 | Selig et al. | |
| 2014/0000705 A1 | 1/2014 | Sounni et al. | |
| 2014/0076380 A1 | 3/2014 | Kalus et al. | |
| 2014/0196764 A1 | 7/2014 | Clavelle et al. | |

FOREIGN PATENT DOCUMENTS

| | | |
|---|---|---|
| EP | 1715260 | 11/2010 |
| EP | 175942 B1 | 5/2011 |
| EP | 2282976 B1 | 4/2013 |

* cited by examiner

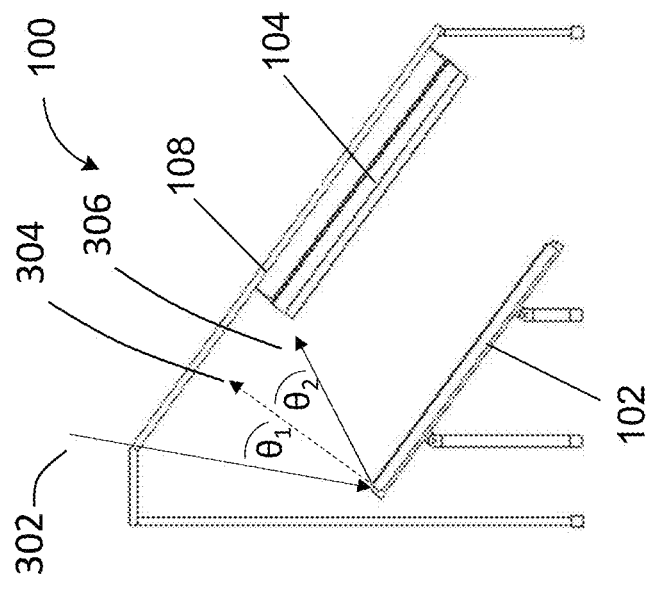
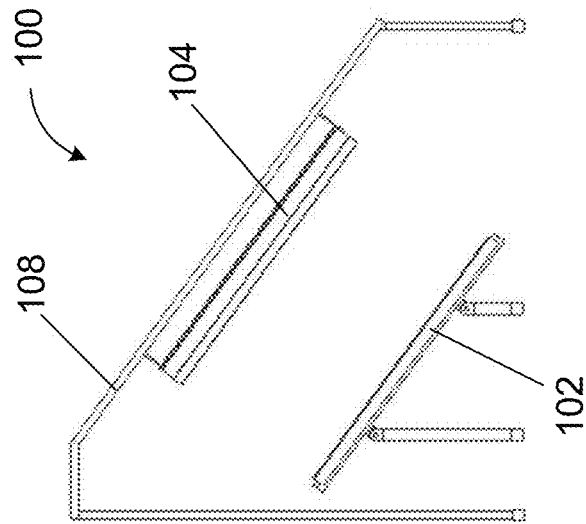
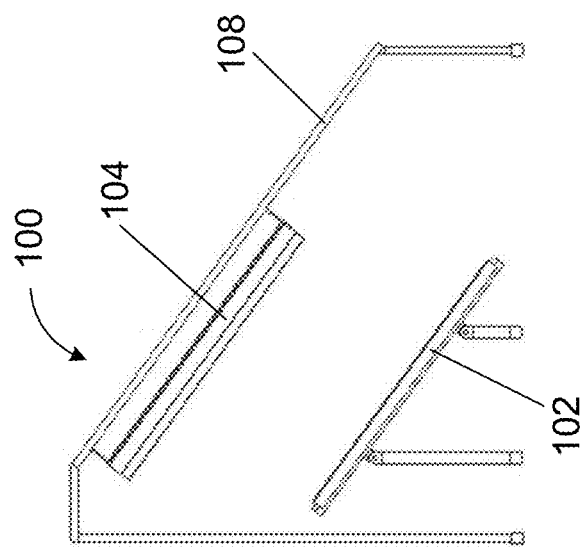
FIG. 3C
FIG. 3B
FIG. 3A

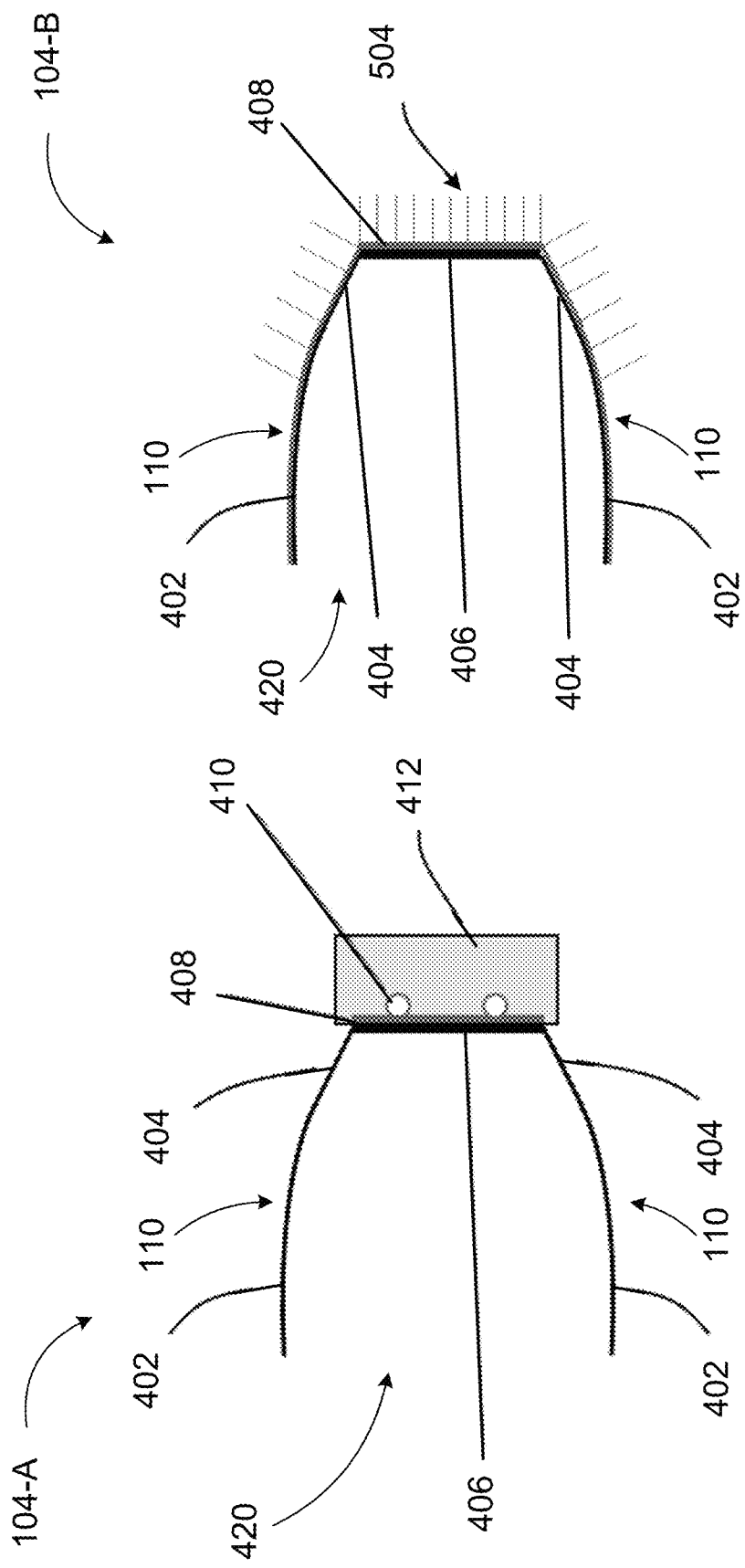

A → 
- Each primary reflector comprises a flat elongated mirror mounted on a structural backing that is rotatably coupled to a frame structure such that each primary reflector may rotate around a corresponding pivot axis. — 913
- The one or more primary reflectors are linked together and rotated at a constant speed based on the location of the sun. — 915
- The one or more primary reflectors are rotated by mechanical means. — 917

B →
- The receiver assembly comprises one or more secondary concentrators. — 919
- The receiver assembly comprises a heat transfer tube. — 921
- The receiver assembly further comprises a photovoltaic panel coupled to the heat transfer tube by a conductive plate. — 923
  - The conductive plate and the heat transfer tube are enclosed in a thermally insular material — 925
- The heat transfer tube is positioned at the center of the receiver assembly and the secondary concentrators are positioned around the heat transfer tube opposite the one or more primary reflectors. — 927
  - A transparent outer tube is located around the heat transfer tube, such that an annular space is formed between the outer tube and the heat transfer tube. — 929

FIG. 9B

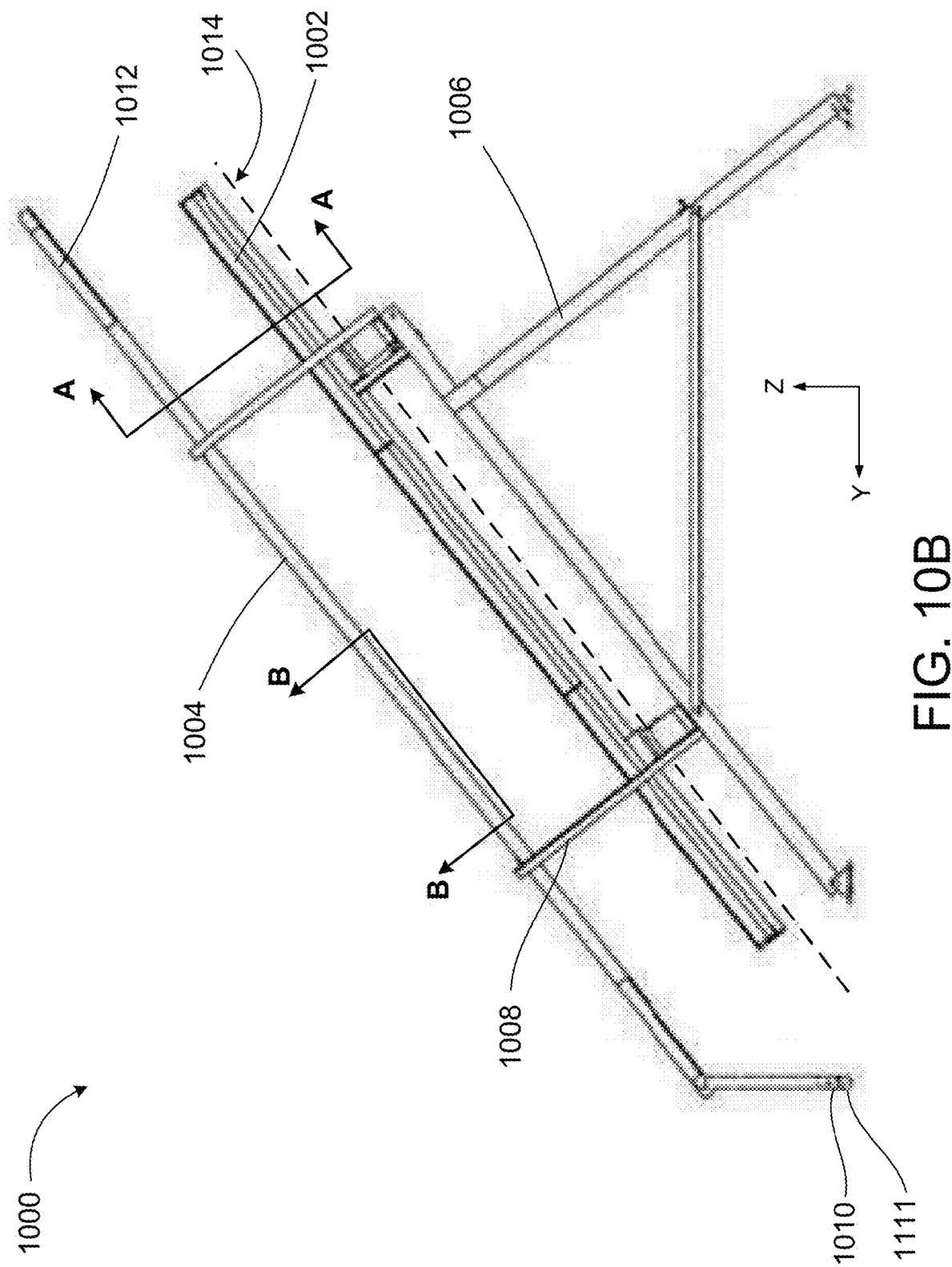

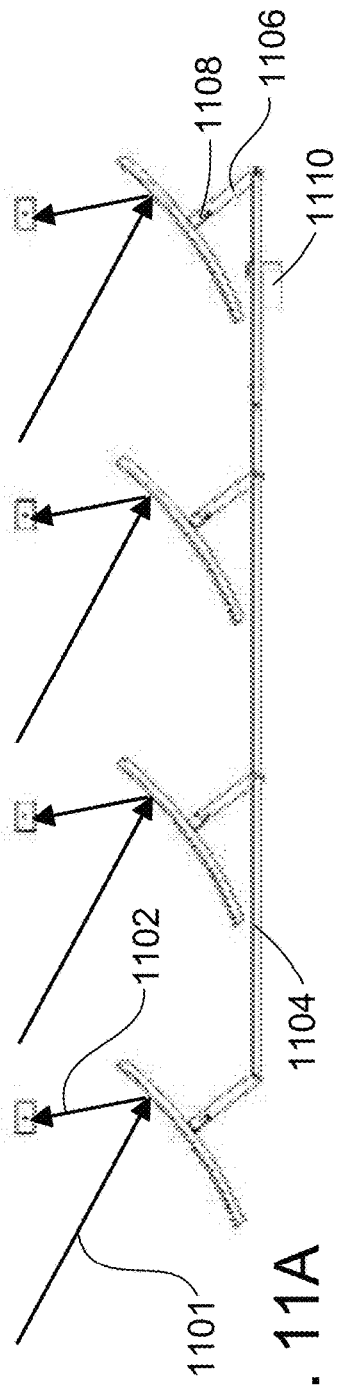
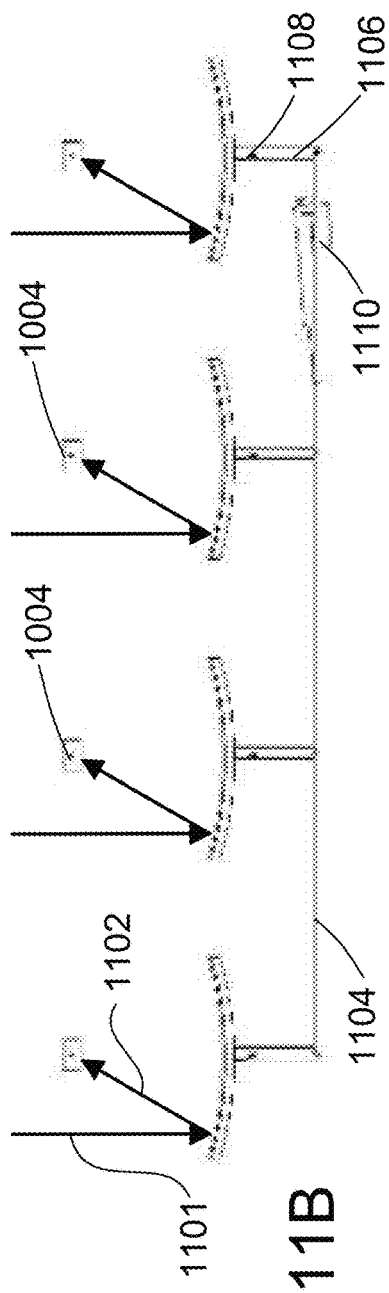
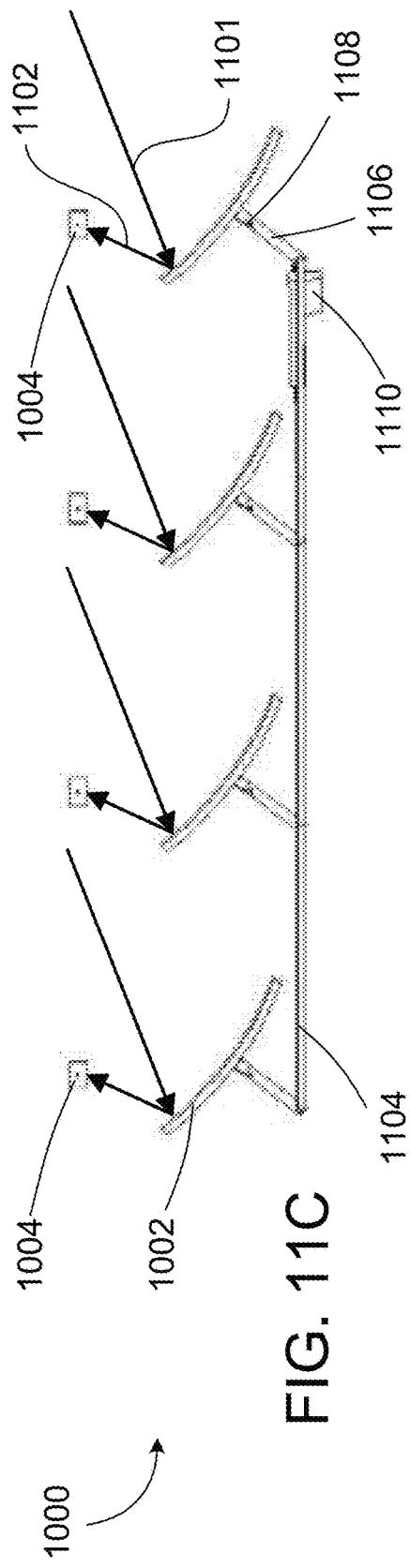

A → 
- The primary reflector comprises an elongated curved mirror mounted on a structural backing that is rotatably coupled to a frame structure such that the primary reflector may rotate around the pivot axis. — 1715
- The primary reflector is rotated at a constant speed based on the location of the sun. — 1717
- The primary reflector is rotated by mechanical means. — 1719

B →
- The receiver assembly comprises one or more secondary concentrators. — 1723
- The receiver assembly comprises a heat transfer tube. — 1725
- The receiver assembly further comprises a photovoltaic panel coupled to the heat transfer tube by a conductive plate. — 1727
  - The conductive plate and the heat transfer tube are enclosed in a thermally insular material — 1729
- The heat transfer tube is positioned at the center of the receiver assembly and the secondary concentrators are positioned around the heat transfer tube opposite the one or more primary reflectors. — 1731
  - A transparent outer tube is located around the heat transfer tube, such that an annular space is formed between the outer tube and the heat transfer tube. — 1735

FIG. 17B

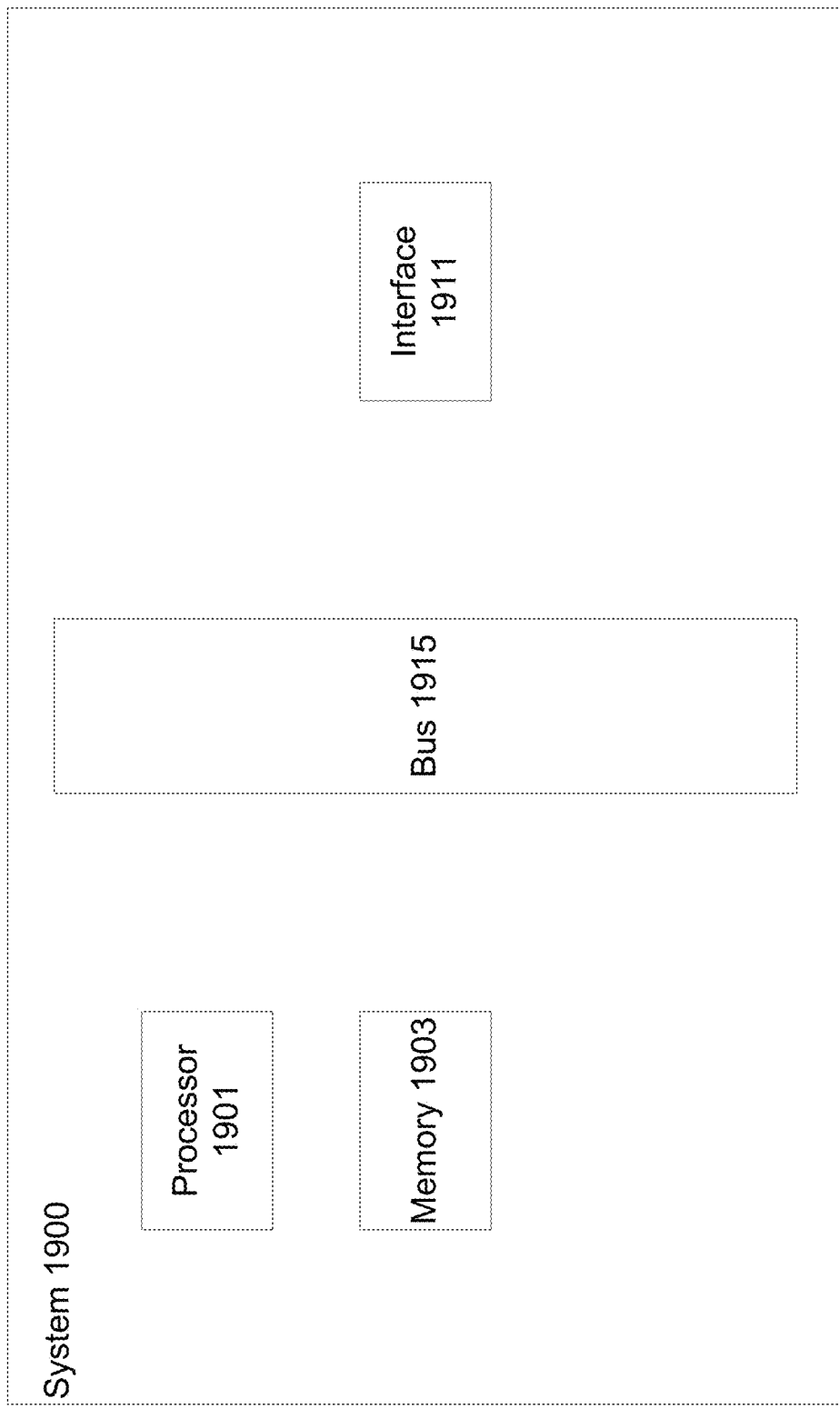

SYSTEMS AND METHODS FOR COLLECTING SOLAR ENERGY USING A PARABOLIC TROUGH SOLAR COLLECTOR

CROSS-REFERENCE TO RELATED APPLICATIONS

This application claims priority under 35 U.S.C. § 119(e) to U.S. Provisional Application No. 62/412,839, filed Oct. 26, 2016, entitled PARABOLIC TROUGH SOLAR COLLECTOR, the contents of which are hereby incorporated by reference.

This application is a continuation-in-part of U.S. patent application Ser. No. 15/374,669 by Craig Wildman, filed on Dec. 9, 2016, titled SYSTEMS AND METHODS FOR COLLECTING SOLAR ENERGY USING A TILTED LINEAR SOLAR COLLECTOR, which application is incorporated by reference herein in its entirety and for all purposes.

TECHNICAL FIELD

The present disclosure relates generally to solar energy collection systems, and more specifically to an apparatus and method to concentrate light for the purposes of generating electricity, heating a fluid, or both generating electricity and heating a fluid simultaneously.

BACKGROUND

Concentrating photovoltaic (CPV) solar energy systems use reflectors or lenses to focus sunlight on photovoltaic solar cells, which generate electric power. By utilizing a light concentration system, the area of photovoltaic cells can be significantly reduced but still generate the same amount of power relative to a photovoltaic system without light concentration. Since a small amount of photovoltaic cell material is used, then more efficient but more costly photovoltaic cells can be economically used since they are a smaller fraction of the system's total capital cost.

Existing systems may also use single-axis tracking systems where the tracking axis is parallel to the Earth's surface. For sites far from the equator, collector systems with this type of tracking system will concentrate light much more efficiently during the summer than winter because of the significant difference in the sun's path through the sky between the seasons. Therefore, the average daily production in the summer will be much higher than the average daily production in the winter, and therefore producing a very uneven seasonal energy output. The peak hourly output will also be much higher than the annual hourly average. An uneven seasonal energy output results in limitations on system integration. A solar energy system is frequently sized based upon the peak hourly output observed in a typical meteorological year. A solar energy system with an uneven seasonal energy output would therefore deliver less energy throughout the year for a fixed peak versus a system with a more uniform energy output.

SUMMARY

Provided are various mechanisms and processes relating to generating synthetic stereo pairs of images using monocular image sequences. In one aspect, which may include at least a portion of the subject matter of any of the preceding and/or following examples and aspects, a solar collector device is provided. The solar collector device comprises a receiver assembly mounted on a frame structure. The receiver assembly comprises a heat transfer tube. The solar collector device further comprises a primary reflector. The primary reflector comprises an elongated curved mirror mounted on a structural backing. The structural backing is rotatably coupled to the frame structure such that the primary reflector may pivot around a pivot axis. The primary reflector reflects light focused upon the receiver assembly such that heat energy from the reflected light is transferred to a heat transfer fluid flowing through the heat transfer tube.

The solar collector device is positioned such that the pivot axis of the primary reflector is aligned from north to south. The primary reflector is tilted toward the equator at an angle that matches the latitude angle of the latitudinal location of the solar collector device. The primary reflector may be rotated around the pivot axis by mechanical means. In some embodiments, the primary reflector and the receiver assembly may be approximately equal in length. The receiver assembly may translate along the frame structure in a direction that is parallel to the pivot axes of the one or more primary reflectors. Alternatively, and/or additionally, the primary reflector may translate along the frame structure in a direction that is parallel to the pivot axes of the one or more primary reflectors.

The receiver assembly may further comprise a photovoltaic panel coupled to the heat transfer tube by a conductive plate. The conductive plate and the heat transfer tube may be enclosed in a thermally insular material. The heat transfer tube may be positioned at the center of the receiver assembly and the secondary concentrators are positioned around the heat transfer tube opposite the one or more primary reflectors. The solar collector device may further comprise a transparent outer tube located around the heat transfer tube, such that an annular space is formed between the outer tube and the heat transfer tube.

Other implementations of this disclosure include systems and processes corresponding to the solar collector device. For instance, a method for collecting solar energy is provided. The method comprises rotating a primary reflector around a pivot axis. The primary reflector comprises an elongated curved mirror mounted on a structural backing that is rotatably coupled to a frame structure such that the primary reflector may rotate around the pivot axis. The primary reflector may be rotated around the pivot axis by mechanical means.

The method further comprises positioning the frame structure such that the pivot axis of the primary reflector is aligned from north to south and tilting the primary reflector toward the equator at an angle that matches the latitude angle of the latitudinal location of the primary reflector.

The method further comprises reflecting light focused from the primary reflector upon a receiver assembly mounted on the frame structure. The receiver assembly comprises a heat transfer tube. In some embodiments, the receiver assembly may further comprise a photovoltaic panel coupled to the heat transfer tube by a conductive plate. The conductive plate and the heat transfer tube may be enclosed in a thermally insular material. In other embodiments, the heat transfer tube may be positioned at the center of the receiver assembly and the secondary concentrators are positioned around the heat transfer tube opposite the one or more primary reflectors.

In some embodiments, the primary reflector and the receiver assembly are approximately equal in length. The method may further comprise translating the receiver assembly along the frame structure in a direction that is parallel to the pivot axis of the primary reflector. Alternatively, and/or additionally, the method may further comprise translating the primary reflector along the frame structure in a direction that is parallel to the pivot axis of the primary reflector. The method further comprises transferring heat energy from the reflected light to a heat transfer fluid flowing through the heat transfer tube.

These and other embodiments are described further below with reference to the figures.

BRIEF DESCRIPTION OF THE DRAWINGS

The disclosure may best be understood by reference to the following description taken in conjunction with the accompanying drawings, which illustrate particular embodiments of the present disclosure.

FIGS. 3A-3C illustrate a side view of the solar collector, adjusted for operation during various seasonal times of the year, in accordance with one or more embodiments.

FIG. 4 illustrates a detailed end-on view of one embodiment of a receiver assembly.

FIG. 5 illustrates a detailed end-on view of a second embodiment of a receiver assembly.

FIGS. 9A and 9B illustrate an example method 900 of collecting solar energy using a tilted linear solar collector, in accordance with one or more embodiments.

FIG. 10B illustrates a side view of the parabolic trough solar collector, in accordance with one or more embodiments.

FIGS. 11A-11C illustrate another view of the parabolic trough solar collector in line with the primary reflectors, in accordance with one or more embodiments.

FIGS. 17A and 17B illustrate another example method 1700 of collecting solar energy using a parabolic trough solar collector, in accordance with one or more embodiments.

FIG. 19 is a block diagram illustrating an example of a system capable of implementing various processes described in the present disclosure.

DETAILED DESCRIPTION

Figure 1:
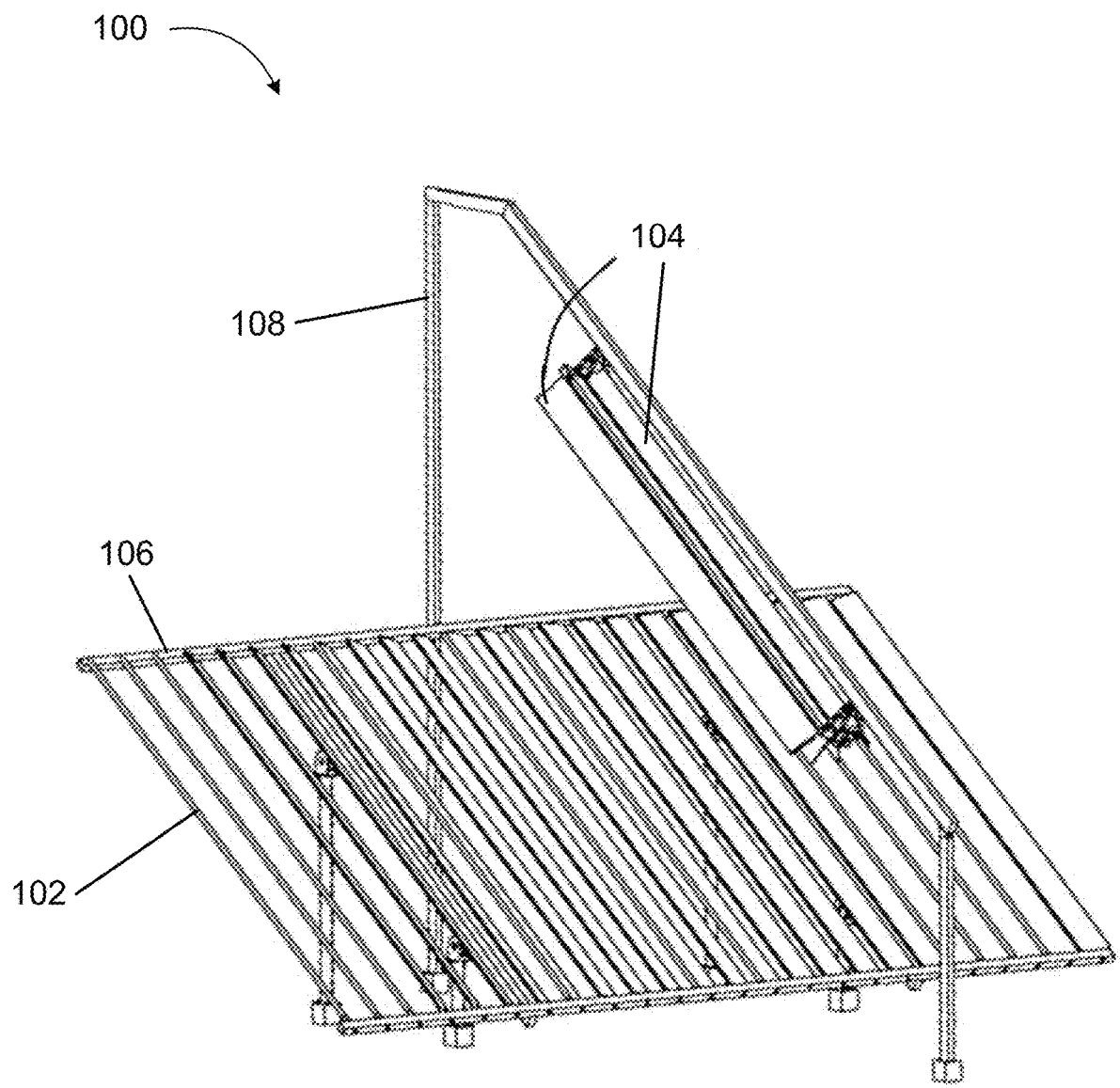
FIG. 1 illustrates a perspective view of an example of a solar collector, in accordance with one or more embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting. On the contrary, it is intended to cover alternatives, modifications, and equivalents as may be included within the spirit and scope of the present disclosure as defined by the appended claims.

For example, the techniques of the present disclosure will be described in the context of particular energy uses, such as water heating. However, it should be noted that the techniques and mechanisms of the present disclosure apply to various other energy uses, such as process heat addition, water desalination, electrical power generation, etc. In the following description, numerous specific details are set forth in order to provide a thorough understanding of the present disclosure. Particular example embodiments of the present disclosure may be implemented without some or all of these specific details. In other instances, well known process operations have not been described in detail in order not to unnecessarily obscure the present disclosure. Various techniques and mechanisms of the present disclosure will sometimes be described in singular form for clarity. However, it should be noted that some embodiments include multiple iterations of a technique or multiple instantiations of a mechanism unless noted otherwise.

Overview

The present disclosure describes an improved solar collector that concentrates solar energy and converts it into electricity, thermal energy, or electricity and thermal energy together. One or more elongated mirrors, called primary reflectors, track the sun about one axis to reflect light upon one or more receiver assemblies. The elongated mirrors may be curved to form an elongated parabolic trough which may reflect light to a focal point or a focal line. The receiver assemblies may comprise a combination of one or more of the following: photovoltaic panels, heat transfer tubes, and side mirrors. In one embodiment, the side mirrors further concentrate the reflected light onto a photovoltaic panel for electricity generation or for electricity plus heat generation by recovering excess heat from the back of the photovoltaic panel. In another embodiment, the mirrors in the receiver can be used to concentrate light onto a heat transfer tube for heat generation.

The whole assembly of elongated mirrors and receivers may be aligned in the north-south direction and tilted toward the equator for a better view of the sun. In particular embodiments, the primary reflectors are longer than the receivers so that the receivers may be fully illuminated by reflected sunlight throughout the year. However, in other embodiments, primary reflectors may be shortened to be at least equal in length with the receivers. In such embodiments, translation of the receivers, primary reflectors, or both may be required to achieve full illumination of receivers through the year.

The receivers may translate along a line that is both in the north-south direction and in parallel to the elongated mirrors, to account for the changing direction of reflected light as the sun's arc through the sky changes with the seasons. Alternatively, and/or additionally, primary reflectors may translate along a line that is both in the north-south direction and in parallel to the elongated mirrors, to account for the changing direction of reflected light as the sun's arc through the sky changes with the seasons. In some embodiments, a cleaning machine is mounted to the assembly of primary reflectors to enable fast, reliable mirror cleaning.

Accordingly, by tilting the collector toward the equator, a more even output profile between different seasons is achieved versus a collector that is oriented parallel to the ground. Second, the collector design enables low-cost construction since the elongated mirrors are relatively flat and are aligned in a way that minimizes wind loading. The receiver's side mirrors combined with the concentration of light enables low-precision optics, which leads to lower fabrication and construction costs. Further advantages will become apparent from a study of the following description and the accompanying drawings.

Example Embodiments

With reference to FIG. 1, shown is a perspective view of an example of a solar collector 100, in accordance with one or more embodiments. The solar collector 100 has a number of primary reflectors 102 that reflect light from the sun toward two receivers 104. In various embodiments, solar collector 100 may include any number of primary reflectors 102. As depicted in FIG. 1, solar collector system 100 includes 24 primary reflectors. However, in other embodiments, there could be as few as one, or more than 24, primary reflectors.

According to various embodiments, primary reflectors 102 can rotate about an axis. The axis may be referred to herein as the rotation axis or axis of rotation. In some embodiments, the axes of rotation of all of the primary reflectors 102 are aligned with one another, aligned with the receivers, and aligned in the north-south direction. Grouped together, the axes of rotation of all the primary reflectors may form a plane. Such plane may be tilted toward the equator. In various embodiments, the angle that the plane is tilted could be higher than 60° versus horizontal to as low as 0° tilt versus horizontal, i.e., parallel to the earth's surface. The embodiment shown in FIG. 1 features a tilt angle of 36° toward the equator and assumes that the solar collector is located at a site with a latitude of 36°. However, in other embodiments, the tilt angle does not need to match the latitude angle. In yet further embodiments, the solar collector could be used at any site from the equator to sites that are north of a latitude of 60° N and south of a latitude of 60° S. In some embodiments, the tilt angle of the primary reflectors 102 is set and does not change. In other embodiments, tilting the primary reflectors 102 may be adjusted manually. However, in other embodiments, the tilt angle of the primary reflectors 102 may be adjusted mechanically, such as by an actuator, which could be an electric motor, a pneumatic system, a hydraulic system, a manual system, or other actuation system.

As shown in FIG. 1, primary reflectors 102 are composed of flat mirrors mounted on a structural backing. In various embodiments, the mirrors may be glass mirrors, metallic mirrors, polymeric mirrors, or any other type of reflective material. The backing can be a metal or plastic frame, a metal stamped part, a composite material, or any other assembly that provides stiffness and strength. As depicted, the mirrors comprising primary reflectors 102 are flat, however such mirrors may be configured in various shapes in other embodiments. For example, such mirrors may be curved to allow larger primary reflector width versus receiver width or to cause a different distribution of reflected sunlight on the receivers in other embodiments.

In some embodiments, the primary reflectors are long in the dimension of their axis of rotation and narrow in the dimension perpendicular to the axis of rotation. Example dimensions could be 4 meters by 0.2 meters; however, the dimensions of the primary reflectors could be varied significantly without detrimental effect to the operation of solar collector 100.

The primary reflectors 102 are mounted on a frame structure 106 that supports them. This structure 106 can be mounted on the ground or on the top of a building or other structure. Structure 106 may also act to keep the primary reflectors 102 oriented properly while also allowing rotation of the primary reflectors 102. The embodiment shown in FIG. 1 features a structure that is 7 meters wide, although this dimension is merely an example and does not represent a design limitation.

Figure 6:
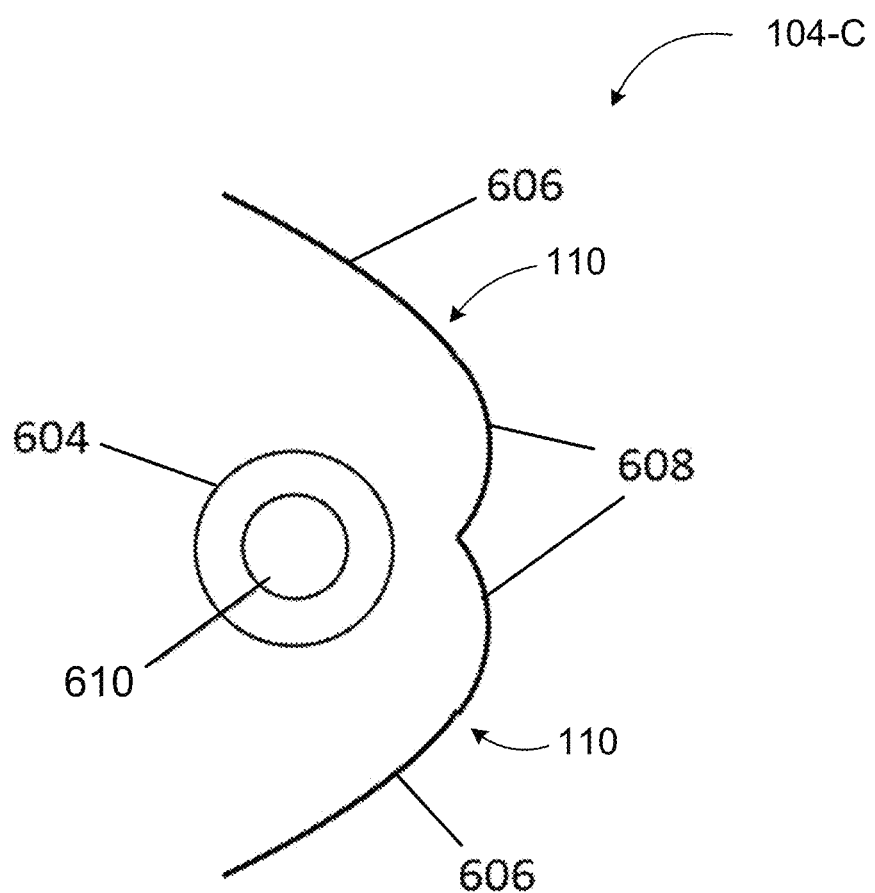
FIG. 6 illustrates a detailed end-on view of a third embodiment of a receiver assembly.

Receivers 104 are offset a distance from the plane formed by the axes of rotation of primary reflectors 102. This distance is approximately 2.3 m in this embodiment, but, in various embodiments, this dimension can be varied considerably without degrading operation. As depicted in FIG. 1, there are two receivers 104 that are each pointed at different halves of the group of primary reflectors 102. Alternatively, there may be a single receiver 104 pointed toward the center of the group of primary reflectors. In further embodiments, there may be three receivers 104. In such embodiments, one receiver 104 may point toward the center of the group of the primary reflectors 102, and the second and third receivers 104 would point toward either side of the group of primary reflectors 102. The distance between the primary reflectors 102 and the receivers 104 would change if the number of receivers 104 were changed or if a receiver 600, as depicted in FIG. 6, were used instead of the receiver 400 described with reference to FIG. 4. In various embodiments, one or more receivers 104 may be mounted on a support structure 108, which keeps them properly positioned about primary reflectors 102. In some embodiments, support structure 108 may be a portion of and/or coupled to frame structure 106.

Figure 2:
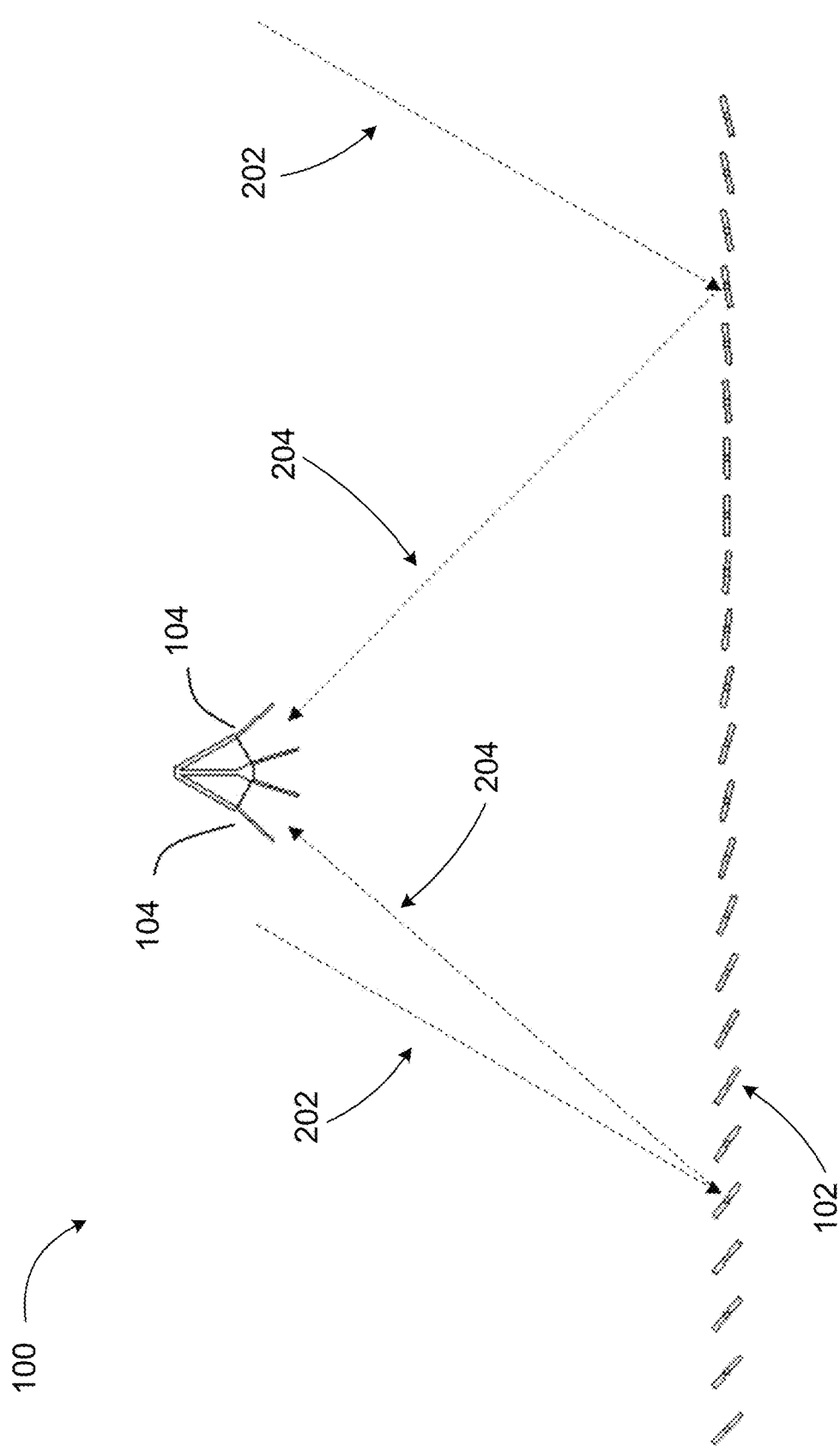
FIG. 2 illustrates a side view of the solar collector observed in line with the primary reflectors, in accordance with one or more embodiments.

FIG. 2 illustrates a side view of the solar collector 100 observed in line with the axes of rotation of primary reflectors 102, in accordance with one or more embodiments. In other words, the view depicted in FIG. 2 shows solar collector 100 from a view that is aligned with the plane of primary reflectors 102. Structural components, such as structures 106 and 108, are omitted from FIG. 2 for clarity of illustrative purposes. FIG. 2 depicts an example embodiment in which solar collector 100 is located at a latitude of 36° North, where the solar collector is tilted toward the Equator at 36°, and where the time and day are 10 am on the vernal equinox. The direct beam of the sun 202 is reflected by the primary reflectors 102, and reflected light 204 is directed to receivers 104. As shown in FIG. 2, the primary reflectors 102 are not rotated at the same angle at the same time. Instead, in various embodiments, the angle of each one is necessarily different to reflect light toward receivers 104. However, in some embodiments, the primary reflectors 102 all rotate at the same speed throughout each day. Thus, in some embodiments, primary reflectors 102 may be linked together and rotated by the same actuator (not shown), which could be an electric motor, a pneumatic system, a hydraulic system, a manual system, or other actuation system. In other embodiments, each primary reflector 102 may be rotated separately.

As previously described, in some embodiments, primary reflectors 102 are tilted at the latitude angle. Consequently, the speed of rotation required to track the sun may be held constant. In embodiments in which primary reflectors 102 move at a constant speed, they could be driven by a simple mechanical system powered by a spring, similar to a mechanical clock or a wind-up toy, by gravity-driven system, or by another simple mechanical energy storage system. Such a system may be manually reset each day. Consequently, it is possible to operate the solar collector with no electric power.

In other embodiments, a simple electric or other automated system could be used to control the primary reflector movement. Additionally, the speed of rotation may instead be varied at times to improve the distribution of reflected sunlight on the receiver.

In some embodiments, primary reflectors 102 may be automatically rotated based time data, astronomical data, and/or location data. For example, a map, a global position system (GPS), or other geolocation device may be used to determine the location of solar collector 100. Astronomical data including the position of the sun relative to the earth may then be retrieved from various databases. Such databases may include global databases accessed through a global network. In other embodiments, such databases may be local databases stored locally in memory. Such information may be processed to determine the optimal rotation for each primary reflector 102. In further embodiments, solar collector 100 may include a light sensor which may be operable to detect the source of light relative to the sensor (and thus, relative to solar collector 100). By tracking the light source and determining the necessary angle of reflection for each primary reflector, the optimal rotation position for each primary reflector may be determined.

In some embodiments, the tilting of the primary reflectors 102 may also be automatically determined and/or controlled based on time data, astronomical data, location data (such as GPS), and/or various sensors, as described. In some embodiments, an actuator may be configured to raise or lower the frame structure 106 and/or the support structure 108 to an optimal angle based on such information.

FIGS. 3A-3C illustrate a side view of solar collector 100, adjusted for operation during various seasonal times of the year, in accordance with one or more embodiments. FIG. 3A illustrates a side view of the solar collector system, adjusted for operation during the winter solstice. FIG. 3B illustrates a side view of the solar collector system, adjusted for operation during the vernal and autumnal equinoxes, in accordance with one or more embodiments. FIG. 3C illustrates a side view of the solar concentrator system in FIG. 1, adjusted for operation during the summer solstice, in accordance with one or more embodiments. In various embodiments, the length of receivers 104 may be equal to the length of primary reflectors 102. However, in other embodiments, the length of receivers 104 may be shorter or longer than the length of primary reflectors 102.

According to various embodiments, receivers 104 may translate along support structure 108 in the direction that is parallel to the axes of rotation of primary reflectors 102. Both receivers 104 may move together. In some embodiments, receivers 104 may be moved very slowly throughout the year to adjust for the changing direction of the reflected light from primary reflectors 102 as the sun's path through the sky changes during the seasons. In the present example embodiment, the total travel from summer position to winter position comprises a translation distance of approximately 2.4 meters. However, in other embodiments, this translation value would vary depending on choices for other dimensions. In some embodiments, the axes of rotation for primary reflectors 102 remain parallel to support structure 108 and receivers 104.

In various embodiments, the movement of the receivers 104, as depicted in FIG. 3A, 3B, and 3C, could be done by a pulley system, with a ball screw system, or with another mechanism. The movement may be powered by an electric system, by a pneumatic system, by a hydraulic system, or by another power system appropriate for automatic control. In other embodiments, movement of receivers 104 may be done with a manual system since the required adjustment could be done perhaps once every few days without a significant loss in optical efficiency. In other embodiments, the optimal translation position of the receivers 104 may be automatically determined and/or controlled based on time data, astronomical data, location data (such as GPS), and/or various sensors, as previously described with reference to the rotation of primary reflectors 102.

In some embodiments, the optimal translation position of the receivers 104 may be automatically determined and/or controlled based on time data, astronomical data, location data (such as GPS), and/or various sensors, as previously described with reference to the rotation of primary reflectors 102. As previously described, the frame structure 106 and/or support structure 108 may be adjusted to various tilt angles, manually or mechanically. In such embodiments, in which the tilt angle is adjusted, translation of the receivers 104 may not be necessary to optimize the light reflected upon receivers 104.

By including a translating receiver 104, solar collector 102 may provide adequate light reflection and concentration without the need for varying the tilt angle. For example, where solar collector 100 is tilted at an angle equal to the latitude angle, primary reflectors 102 and receivers 104 are parallel to the axis of rotation of the Earth. The sun vector projected into the plane formed by the North-South and zenith axes 302 and the normal vector of the primary reflector projected into the same plane 304 form an angle θ1. For the case where primary reflectors 104 are aligned with the rotational axis of the Earth, this angle θ1 remains constant throughout each day of the year. Furthermore, the angle θ2 formed by the projection of the reflected light vector 306 and the primary reflector normal vector 304 also remains constant throughout the day.

On any given day, light reflected on a particular spot on a primary reflector 102 will be reflected to a constant lengthwise location on the plane of the receiver 104 since the receiver 104 is also aligned with the axis of rotation of the Earth and with the primary reflector 102. From one day to the next, the position of the Earth relative to the sun changes. The angle θ1 between the projection of the sun vector 302 and primary reflector normal vector 304 therefore changes, and the lengthwise location of the reflected light on the receiver 104 also changes. In some embodiments, the receiver 104 may slide throughout the seasons to accommodate this change. In some embodiments, the tilt angle would have to be adjusted drastically and often throughout a given day to achieve the same level of light reflection and concentration. As a result, solar collector 100 may be configured using fewer moving parts and may operate with less movement, which not only reduces the cost of production, but also reduces the opportunity for mechanical failure.

The light reflected by a primary reflector 102 projects a long narrow reflection along the receiver plane. In some embodiments, those primary reflectors 102 further from the center of the solar collector 100 project a longer reflection than the ones closer to the center of the solar collector 100 such that the length of the reflected light is longer than the receiver. Some spillage off the ends of the receiver may be an accepted efficiency loss in certain embodiments.

The translating receiver 104 configuration described herein may also compensate for a less precise tilt angle of solar collector 100. For example, in some instances, the tilt angle may not be equal to the latitude angle. In such cases, the angles θ1 and θ2 from FIG. 3C will not be constant throughout the day, and the receiver may slide during each day to account for the changing lengthwise position of the reflected light on the plane of the receiver. Although not depicted in FIGS. 3A and 3B, the angles and vectors described above with reference to FIG. 3C also correspond and apply to FIGS. 3A and 3B.

FIGS. 4-6 illustrate detailed end on views of various embodiments of a receiver assembly. FIG. 4 illustrates a detailed end-on view of one embodiment of a receiver assembly 104-A. In some embodiments, receiver assembly 104-A may be receiver 104. FIG. 4 depicts a receiver 104-A designed for combined heat and power generation. Light reflected from primary reflectors 102 may enter an aperture 420 defined by mirrors 110 on two sides (secondary concentrators) and a photovoltaic (PV) panel 406 in the center at the back of the receiver opening 420. In various embodiments, photovoltaic panel 406 converts light to electricity. The efficiency of electricity generation may depend on the choice of photovoltaic panel 406 and other factors. For example, if the PV panel 406 is 20% efficient and if 8% of the incident light is reflected, then 72% of the light may be converted to heat. In the receiver design depicted in FIG. 4, most of this heat may be used to heat a liquid that is conveyed through heat transfer tubes 410 located behind the PV panel 406. Although two tubes 410 are shown in FIG. 4, one or more tubes 410 could be used in other embodiments.

In various embodiments, a highly thermally conductive plate 408 may be located between PV panel 406 and tubes 410 to convey heat laterally from the back side of PV panel 406 to the tubes 410. In some embodiments, a highly thermally conductive paste may be used instead. In other embodiments, instead of comprising heat transfer tubes 410, flow channels may be integrated into conductive plate 408. PV panel 406 and tubes 410 may be put in good thermal contact with conductive plate 408. Alternatively, conductive plate 408 may be omitted in embodiments where PV panel 406 may be constructed to be sufficiently thermally conductive. In some embodiments, insulation 412 may be located behind heat transfer tubes 410 and thermally conductive plate 408 to reduce heat loss to the environment. In some embodiments, insulation may fully enclose conductive plate 408 and/or heat transfer tubes 410.

Also shown in FIG. 4, the side mirrors 110, also called secondary concentrators, may serve to provide a wider target for the reflected light from primary reflectors 102. Secondary concentrators 110 may also serve to flatten the distribution of concentrated solar flux on photovoltaic panel 406. In some embodiments, secondary concentrators 110 each comprise two segments. As depicted in FIG. 4, secondary concentrators 110 include a parabolic shaped mirror segment 402 nearer to the opening 420. A flat mirror segment 404 is located between the parabolic shaped segment 402 and photovoltaic panel 406. In some embodiments flat mirror segments 404 may restrict the angle of incidence of light upon the photovoltaic panel 406 to a maximum value, such as 60°, since photovoltaic panel efficiency tends to fall at high angle of incidence. The two-stage secondary concentrator 110 shown in FIG. 4 is one embodiment. In other embodiments, secondary concentrator 110 may be composed entirely of parabolic shaped mirrors, composed entirely of flat mirrors, composed of mirrors of other shapes such as elliptical or hyperbolic, or any combination thereof.

FIG. 5 illustrates a detailed end-on view of a second embodiment of a receiver assembly 104-B. In some embodiments, receiver assembly 104-B may be receiver 104. FIG. 5 shows a receiver embodiment designed for electricity generation only. As depicted, the mechanism of light capture in this embodiment is identical to that of the embodiment in FIG. 4. However, in FIG. 5, the heat dissipation mechanism is different. As described in FIG. 4, a two-stage secondary concentrator 110 further concentrates light on a photovoltaic panel 406. In some embodiments, excess heat is dissipated to the atmosphere by fin heat sinks 504, or other similar structures or devices that can efficiently transfer heat from a solar panel to ambient air. Receiver assembly 104-B may also include a conductive plate 408 which may transfer heat from the PV panel 406 to the fin heat sinks 504. As such, PV panel 406 and fin heat sinks 504 may be put in good thermal contact with conductive plate 408.

FIG. 6 illustrates a detailed end-on view of a third embodiment of a receiver assembly 104-C. In some embodiments, receiver assembly 104-C may be receiver 104. FIG. 6 shows a receiver embodiment designed for heat generation only. The receiver design depicted in FIG. 6 features secondary concentrators 110 composed of two different mirror shapes. The outer portion 606 of the mirrors 110 is in the shape of a parabola. The inner portion 608 is in the shape of an involute of a circle. In other embodiments, other mirror shapes may be used as well. A heat transfer tube 610 is located in the center of the receiver assembly 104-C, and the light is focused on this tube. A heat transfer fluid flows in the heat transfer tubes, and the fluid rises in temperature as a result of heating by the concentrated sunlight. In various embodiments, the heat transfer fluid may be water. In other embodiments, the heat transfer fluid may comprise any fluid that meets the specific requirements and/or temperature performance of an application, such as an antifreeze mixture for freeze protection, such as ethylene glycol or propylene glycol. In various embodiments, different factors may be considered for the type of heat transfer fluid, such as specific heat capacity, thermal conductivity, temperature range, and toxicity. For example, for a nontoxic freeze protection, propylene glycol may be selected. However, for even lower temperatures, ethylene glycol may be selected if toxicity is not an issue. In warmer climates, water may be adequate as freeze protection.

In some embodiments, a transparent tube 604 may be located around heat transfer tube 610 forming an annular space between transparent tube 604 and heat transfer tube 610. This transparent tube 604 acts to reduce heat loss from the heat transfer tube 610. In some embodiments, the annular space between heat transfer tube 610 and transparent tube 604 can be evacuated to reduce heat transfer further between the two tubes. This receiver geometry depicted in FIG. 6 may allow for a wider acceptance angle of light relative to the receiver designs in FIGS. 4 and 5. This may allow receiver 104-C may be positioned closer to the primary reflectors.

Figure 7:
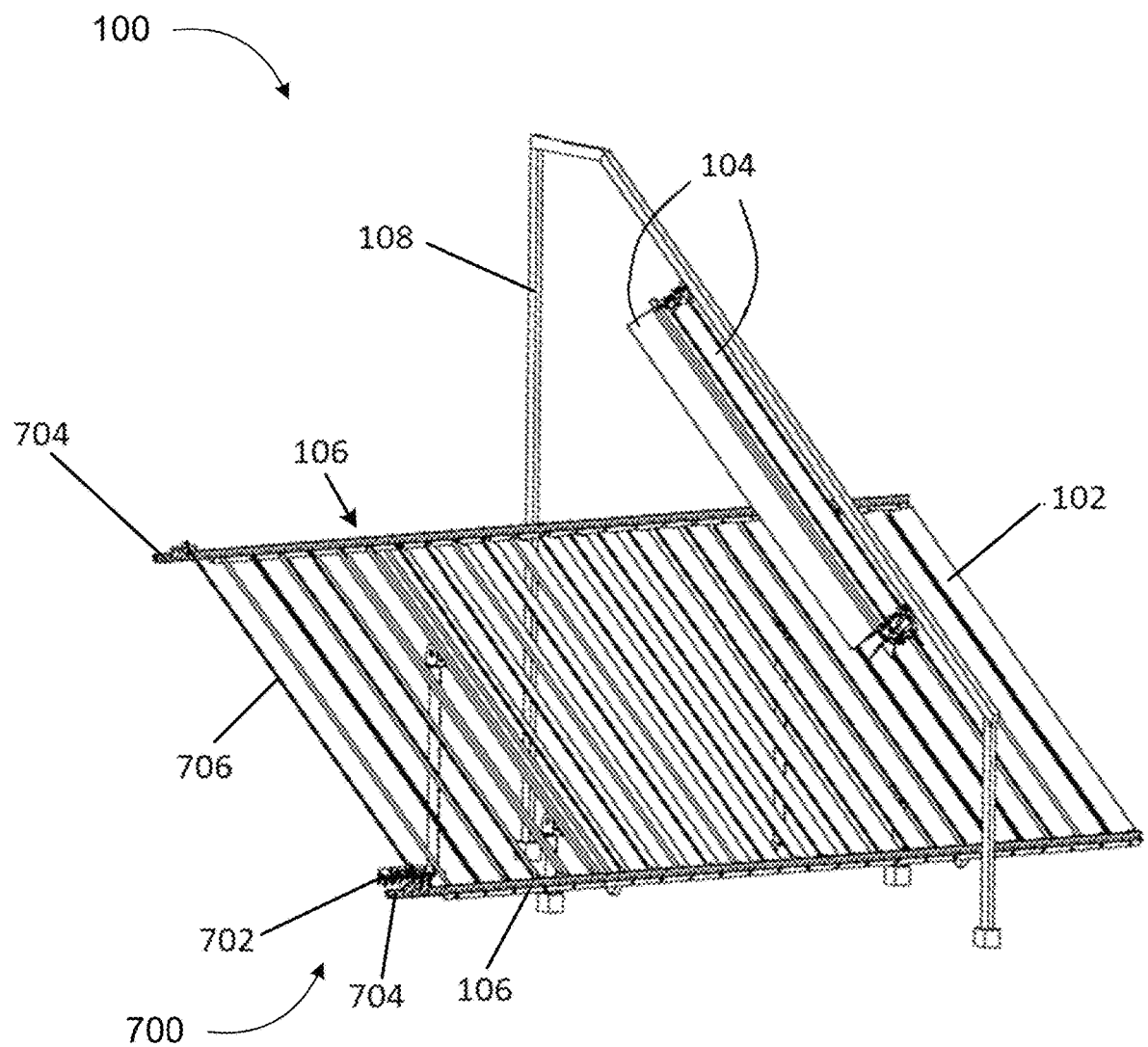
FIG. 7 illustrates a perspective view of an example of a solar collector with a mirror cleaning system, in accordance with one or more embodiments.
Figure 8:
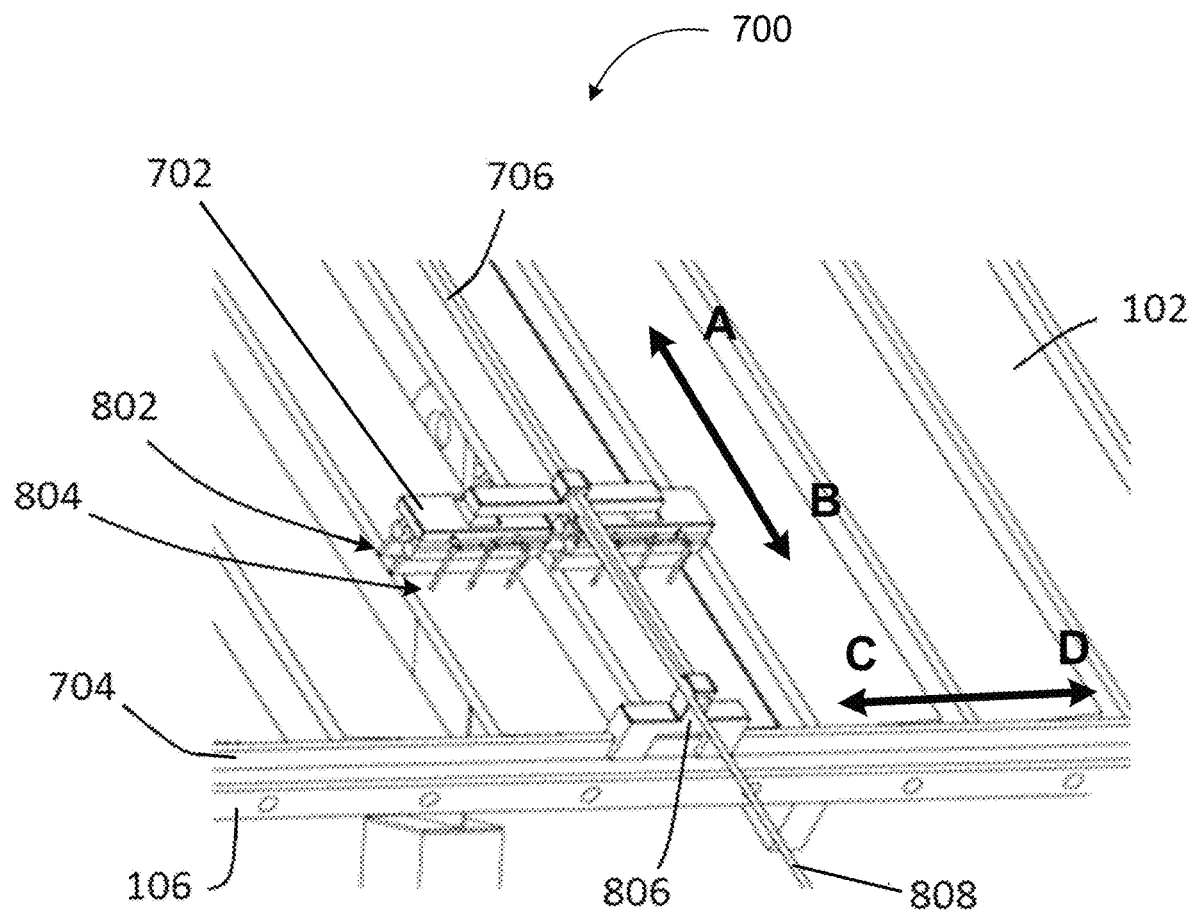
FIG. 8 illustrates a detailed perspective view of the mirror cleaning system, in accordance with one or more embodiments.

A mirror cleaning system 700 may be described with reference to the following FIGS. 7 and 8. FIG. 7 illustrates a perspective view of an example of a solar collector 100 with a mirror cleaning system 700, in accordance with one or more embodiments. The embodiment depicted in FIG. 7 differs from the one presented in FIG. 1 in that it includes a mirror cleaning system 100 comprising mirror cleaning machine 702, rails 704, and linear guide 706. FIG. 8 illustrates a detailed perspective view of the mirror cleaning system, in accordance with one or more embodiments.

In various embodiments, mirror cleaning machine 702 may be mounted on linear guide 706 that extends from one end of the primary reflectors 102 to the other end. Mirror cleaning machine 702 may move along linear guide 706 from one end of primary reflectors 102 to the other in the direction of arrows A and B. The linear guide 706 may be attached to two travelers 806, one at each end of the primary reflectors 102. The two travelers 806 may move laterally, in the direction of arrows C and D, relative to the frame structure 106 on two rails 704 that are mounted on the tops of the structural cross beams of frame structure 106. In some embodiments, this arrangement allows the mirror cleaning machine to move from one end of the primary reflectors 102 to the other end of the primary reflectors 102 to clean them.

In some embodiments, two mirrors are cleaned at a time, although one or more than two mirrors could be cleaned at a time in other embodiments. Once mirrors are cleaned, the mirror cleaning machine 702 along with the linear guide 706 and the travelers 806 may be moved laterally to the next mirrors to be cleaned. Continuing with FIG. 8, the mirror cleaning machine 702 depicted in this embodiment comprises two wipers 802 and a series of water pipes and nozzles 804. In various embodiments, the mirror cleaning machine 702 cleans the mirror by starting at the top of the primary reflectors 102, squirting water, or other cleaning fluid, onto the mirror surface, and then moving down the mirror along linear guide 706 toward the bottom, wiping the water and any soiling off the mirror with wipers 802 as it moves along. Once the mirror cleaning machine 702 reaches the bottom of the mirror, it may be moved to the next two mirrors, in either direction C or D, and then raised to the top along linear guide 706 to clean them. In some embodiments, cleaning machine 702 may include water pipes and nozzles 804 on either side of wipers 802 allowing cleaning machine 702 to clean the mirrors of primary reflectors 102 when moving in either direction A or B.

Although two wipers 802 per mirror are shown in FIG. 8, one or more than two may be included in various embodiments of mirror cleaning system 700. Similarly, while three water nozzles 804 per mirror are shown, fewer or more than three may be included in various embodiments. In some embodiments, a hose 808 supplies the mirror cleaning machine with water or other cleaning fluid. In various embodiments, the movement of mirror cleaning machine 702 can be powered by manual means, by electric motors and a pulley system, by water power, by pneumatics, by a combination of the aforementioned methods, or by any other means.

In various embodiments, solar collector 100 provides several advantages, described below without limitation. Solar collector 100 is low cost and simple to operate and that it generates a more uniform seasonal energy output profile. Because of the efficient concentration of light by the disclosed configurations, the photovoltaic panel area required may also be less than one tenth what would be required for a non-concentrating photovoltaic system. This also results in more efficient and consistent heat energy collection throughout the year. By tilting solar collector 100 toward the equator, the output between winter and summer is significantly more uniform compared with a horizontal system as well.

The primary reflectors 102 are flat and simple, and are configured to concentrate light to sufficient degree for many applications. In some embodiments, the configuration of primary reflectors 102 may provide the same or better light concentrations than other mirror configurations and shapes, such as parabolic or other curved shapes. However, they are thin and flat enough to be arranged such that wind loading is reduced, which reduces the requirements for their structural supports, such as 106 and 108. Flat mirrors are further simpler and cheaper to construct than curved mirrors.

The tracking mechanism can be simple since the primary reflectors all rotate at the same speed and, if tilted at the latitude angle, rotate at a constant speed through the day. In addition, including a sliding receiver 104 may allow solar collector 100 to be positioned at a fixed tilt angle throughout the year. This eliminates the need to drastically alter the tilt angle through the day to compensate for the movement of the sun. Such sliding receiver 104 may also compensate for less precise tilt angles. Such tracking mechanism may be performed by a simple mechanical energy storage system without electrical power, such as a spring, gravity-driven system, etc. However, the tracking mechanism may also be automated and implement wireless and GPS technologies to accurately determine the optimal angle to tilt solar collector 100, the optimal rotation for each primary reflector 102, and/or the optimal translation position for receiver assembly 104.

Figure 9A:
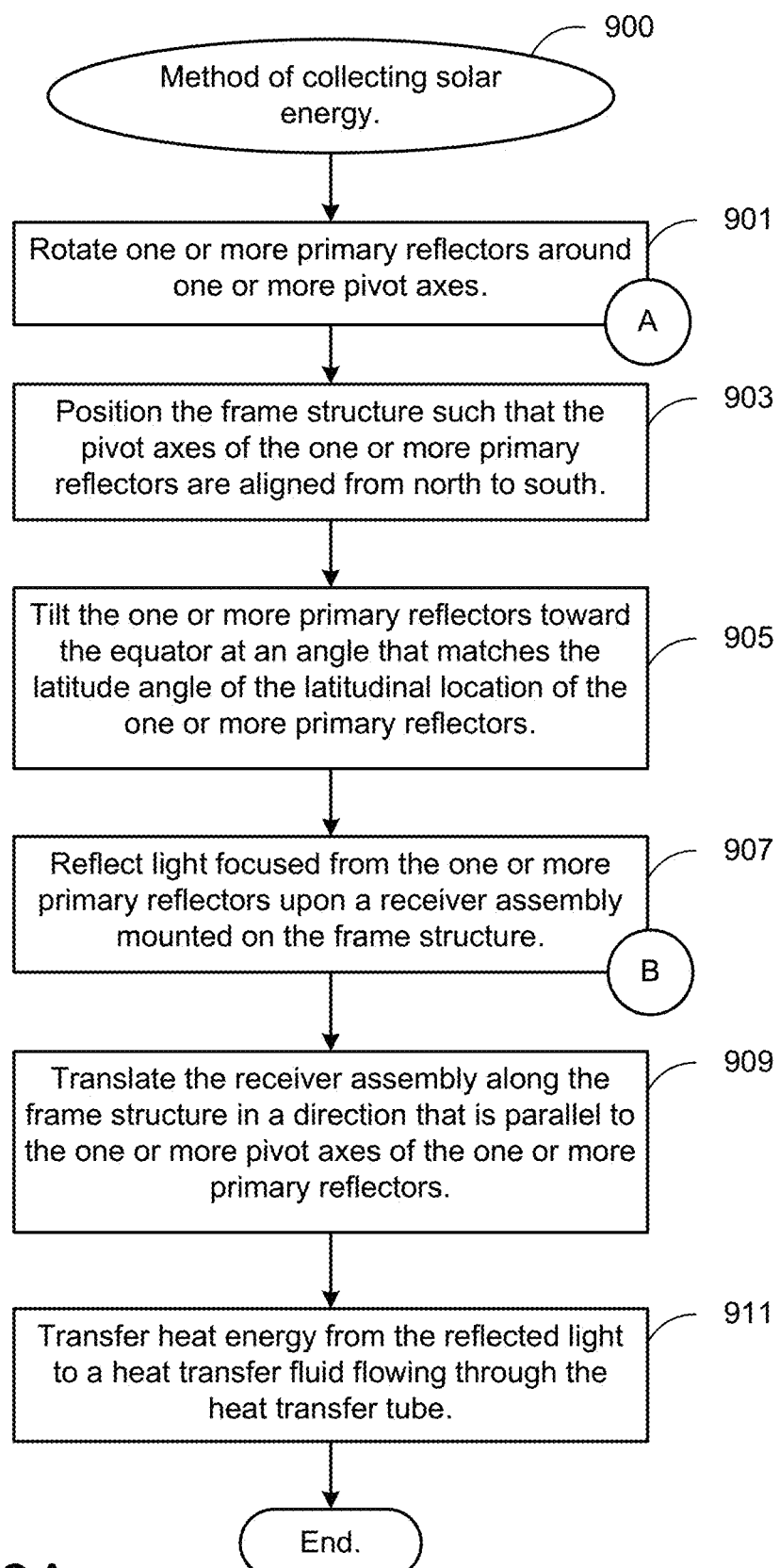

FIGS. 9A and 9B illustrate an example method 900 of collecting solar energy using a tilted linear solar collector, in accordance with one or more embodiments. At step 901, one or more primary reflectors 913 are rotated around one or more pivot axes. In some embodiments, each primary reflector 913 comprises a flat elongated mirror mounted on a structural backing that is rotatably coupled to a frame structure such that each primary reflector 913 may rotate about a corresponding pivot axis. In some embodiments, primary reflectors 913 may be primary reflectors 102, the configuration of which are described with reference to FIGS. 1 and 2.

In some embodiments, the one or more primary reflectors are linked (915) together and rotated at a constant speed based on the location of the sun. In some embodiments, the rotation of the primary reflectors 913 about the pivot axes tracks the position of the sun through the day. In various embodiments, this may provide the optimal angle for reflection of sunlight from the primary reflector 913 to a receiver assembly, such as 104. As previously described with reference to FIG. 2, although the primary reflectors 913 may be linked (915), they may not necessarily all be positioned at the same rotation. The rotation position of a primary reflector 913 about a pivot axis may depend on the position of the primary reflector relative to the receiver assembly.

In some embodiments, the one or more primary reflectors 913 are rotated by mechanical means 917. As previously described, such mechanical means 917 may comprise an electric motor, a pneumatic system, a hydraulic system, a manual system, or other actuation system. As previously described, such rotation position of primary reflectors 913 may be automatically determined by time data, astronomical data, and/or location data (such as GPS).

Additional steps may be performed to further optimize the amount of light reflected upon a receiver assembly. At step 903 the frame structure is positioned such that the pivot axes of the one or more primary reflectors 913 are aligned from north to south. This may position align the pivot axes, such the one or more primary reflectors 913 are able to track the location of the sun by rotating about the pivot axes as described in step 901. At step 905, the one or more primary reflectors 913 are tilted toward the equator at an angle that matches the latitude angle of the latitudinal location of the one or more primary reflectors 913. As previously described, tilting the primary reflectors 913 toward the equator to match the latitude angle may further increase the amount of sunlight reflected by the primary reflectors 913. However, in other embodiments, the tilt angle does not need to match the latitude angle and may be tilted as low as 0° to higher than 60°.

At step 907, light focused from the one or more primary reflectors 913 is reflected upon a receiver assembly mounted on the frame structure. In some embodiments the receiver assembly may be receiver assembly 104, 104-A, 104-B, or 104-C. In some embodiments, the receiver assembly comprises one or more secondary concentrators 919. In some embodiments secondary concentrators 919 may be secondary concentrators 110. The receiver assembly may also comprise a heat transfer tube 921. In some embodiments, heat transfer tube 921 may be heat transfer tube 410 and/or 610.

In some embodiments, the receiver assembly may further comprise a photovoltaic panel 923 coupled to the heat transfer tube 921 by a conductive plate 925. In some embodiments, photovoltaic panel 923 may be photovoltaic panel 406, and conductive plate 925 may be conductive plate 408. In some embodiments, the conductive plate 925 and the heat transfer tube 921 are enclosed in a thermally insular material, such as insulation 412. In some embodiments, the photovoltaic panel 923 may also be partially or entirely enclosed in the thermally insular material. In some embodiments configured for electricity generation only, such as receiver assembly 104-B, the receiver assembly may not comprise a heat transfer tube 921. Instead, such embodiments of the receiver assembly may comprise heat sinks, such as fin heat sinks 504.

In various embodiments, the solar collector device 100 may be configured for heat generation only, such as described in FIG. 6. In such embodiments, the heat transfer tube 921 may be positioned at the center 927 of the receiver assembly and the secondary concentrators 919 are positioned around the heat transfer tube 921 opposite the one or more primary reflectors 913. In further embodiments, a transparent outer tube 929 may be located around the heat transfer tube 921, such that an annular space is formed between the outer tube 929 and the heat transfer tube 921. In some embodiments, the transparent outer tube 929 allows light to penetrate through to heat the heat transfer tube 921 while working to trap heat within the annular space. In some embodiments, the annular space may be evacuated to create a vacuum between the heat transfer tube 921 and the outer tube 929, thereby decreasing potential heat loss from the heat transfer tube 921. In various embodiments, the receiver assembly may comprise any combination of one or more of the following: secondary concentrators 919, heat transfer tube 921, photovoltaic panel 923, conductive plate 925, and insular material.

At step 909, the receiver assembly is translated along the frame structure in a direction that is parallel to the one or more pivot axes of the one or more primary reflectors 913, such as previously described with reference to FIGS. 3A-3C. Step 909 may be performed to further optimize the amount of light reflected upon a receiver assembly. As previously described, translating the receiver assembly may be automatically determined by time data, astronomical data, location data (such as GPS), and/or various sensors.

At step 911, heat energy from the reflected light is transferred to a heat transfer fluid flowing through the heat transfer tube 921. In various embodiments, the temperature of the heat transfer fluid may rise up to well over 200° C. In some embodiments, the maximum temperature generated may be limited by the construction of the photovoltaic panels 923, as the efficiency of photovoltaic cells in a photovoltaic panel 923 may decrease as temperature increases beyond a certain threshold. For example, a particular PV panel 923 may be rated to function at a max temperature of 85° Celsius.

In some embodiments, temperatures of 80° Celsius to 85° Celsius may be adequate to heat water for residential or commercial usage, desalination, industrial processes, and/or water treatment. However, in embodiments of solar collector 100 that are configured for heat generation only, there may be no such limit to the maximum temperature that can be reached. In some embodiments, heat generated by solar collector 100 may be used for steam generation. In other embodiments, other fluids may be heated for various commercial uses, such as brewing beverages, and/or various industrial process needs, such as separating crude oil from water or ethanol distillation.

Figure 10A:
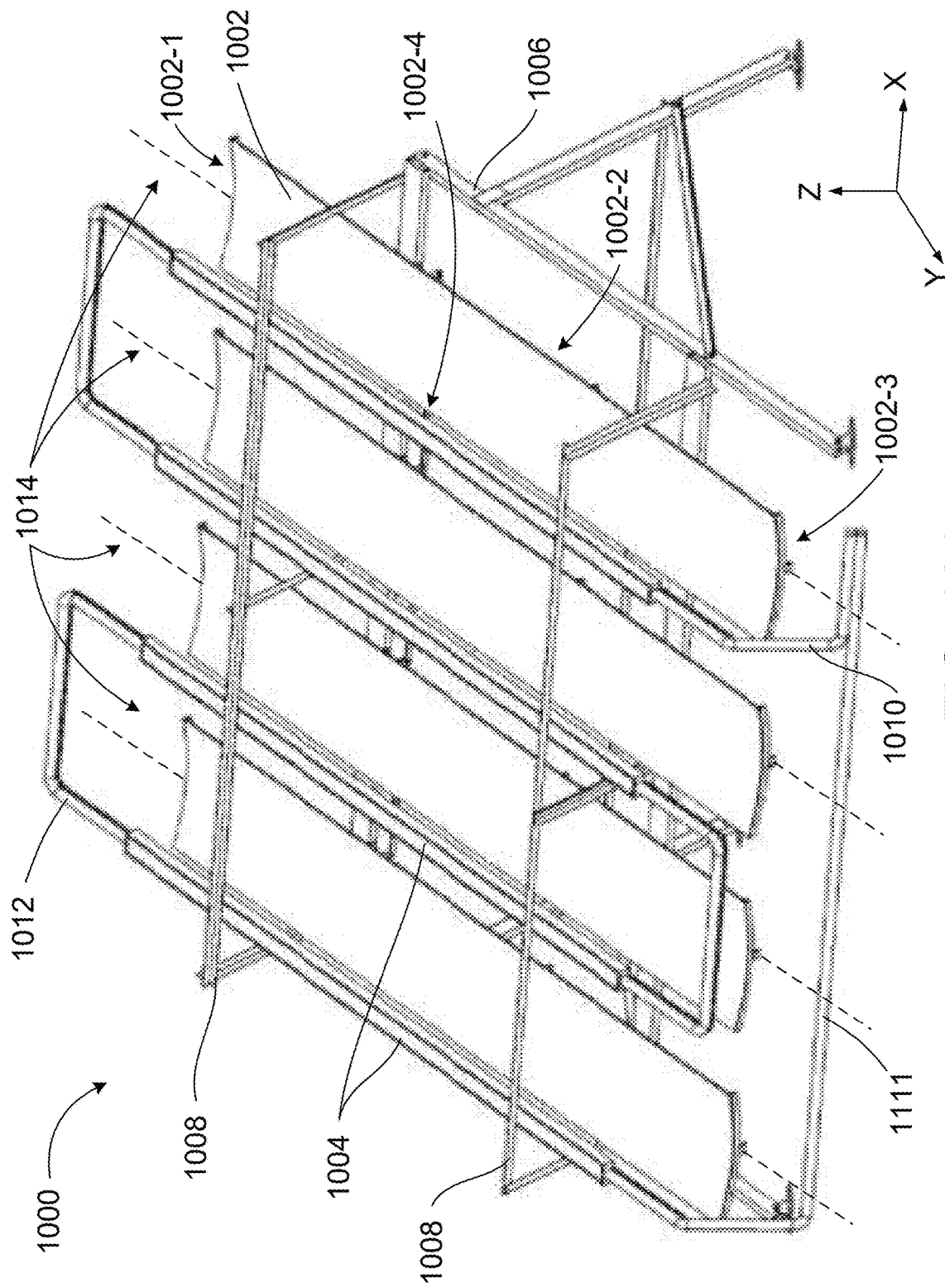
FIG. 10A illustrates a perspective view of a parabolic trough solar collector, in accordance with one or more embodiments.

Further embodiments of solar collectors are described with reference to FIGS. 10A-10B, 11A-11C, 12, 13A-13C, 14A-14C, 15A-15C, and 16A-16B below. In certain embodiments, a solar collector may include primary reflectors comprising elongated mirrors that may be curved in the shape of a parabolic trough configured to focus light onto one or more receiver assemblies. With reference to FIGS. 10A and 10B, shown is an example of a parabolic trough solar collector 1000, in accordance with one or more embodiments. FIG. 10A illustrates a perspective view of a parabolic trough solar collector 1000. FIG. 10B illustrates a side view of the parabolic trough solar collector 1000. In various embodiments, solar collector 1000 comprises elongated primary reflectors 1002 and elongated receivers 1004. In some embodiments, receivers 1004 may be receivers 104. In some embodiments, receivers 1004 include a length 1052 (shown in FIG. 12) and a width 1053 (shown in FIGS. 16A and 16B). In some embodiments, each reflector 1002 rotates about one axis to track the sun and to reflect light onto receivers 1004, which are offset some distance from the reflectors 1002. In various embodiments, solar collector 1000 may include at least one reflector 1002 for reflecting light onto at least one receiver 1004.

Each reflector 1002 may reflect light onto one receiver 1004. However, in other embodiments, one or more reflectors 1002 may reflect light onto one receiver 1004. In yet further embodiments, on reflector may reflect light onto one or more receivers 1004. In some embodiments, frame structure 1006 may support and keep properly aligned the reflectors 1002, receivers 1004, and other parts. In some embodiments, frame structure 1006 may be frame structure 106. In some embodiments, receivers 1004 may be mounted to a support structure 1008, which keeps them properly positioned about primary reflectors 1002. In some embodiments support structure 1008 may be support structure 108. In some embodiments, support structure 1008 may be a portion of and/or coupled to frame structure 1006. In some embodiments, piping system 1012 may convey fluid from an inlet 1111 to each receiver 1004 and then to an outlet 1010. In some embodiments, piping system 1012 may include heat transfer tubes located within a receiver assembly, such as heat transfer tubes 410 and 610 previously described, and/or heat transfer tube 1613 described below.

As depicted in FIGS. 10A and 10B, in some embodiments, reflectors 1002 and receivers 1004 are aligned in the north-south direction. For reference, in an embodiment, a solar collector 1000 shown in FIGS. 10A and 10B, may be 2.8 m wide along the X axis, 2.5 m from front to rear along the Y axis, and 2 m tall along the Z axis, although the solar collector could be a wide range of sizes. Reflectors 1004 may rotate about an axis aligned in this direction, such as axes 1014. In various embodiments, reflectors 1002 and receivers 1004 are parallel to one another and are tilted toward the equator for a better view of the sun.

The embodiment shown in FIGS. 10A and 10B features a tilt angle of 38° and is designed for a flat site at latitude of 38°. However, in other embodiments, the system may be designed for any latitude. Tilting reflectors 1002 at an angle equal to the location's latitude angle may result in the highest yearly incident light on the receiver. However, in some embodiments, the tilt angle may be set to other angles to accommodate special requirements of a project, such as a desire for lower wind loading or increased summer output. In some embodiments, the tilt angle may be zero, such that reflectors 1002 and receivers 1004 are aligned parallel to the ground. In some embodiments, frame structure 1006 may also be adjusted to mount the solar collector 1000 on a slanted roof or slope on the ground. As previously described with reference to solar collector 100, the tilt angle of solar collector 1000 may be adjusted. Additionally, such adjustment of the tilt angle may be automatically determined and/or controlled based on time data, astronomical data, location data (such as GPS), and/or various sensors, as described. In some embodiments, an actuator may be configured to raise or lower the frame structure 1006 and/or the support structure 1008 to an optimal angle based on such information.

In various embodiments, reflectors 1002 are elongated mirrors that may comprise of glass, metal, a polymer, or another reflective surface. Reflectors 1002 may feature a shallow curve in the shape of a parabola so that they both redirect light and concentrate the light onto receivers 1004. In other words, two elongated edges, such as edges 1002-2 and 1002-4, may be curved upwards to form a parabolic trough. The curved shape of reflectors 1002 is shown in the curved shape of the edges, such as edges 1002-1 and 1002-3, in FIG. 10A, as well as in the viewpoints shown in FIGS. 11A-C described below. In some embodiments, reflectors 1002 may be constructed from flat mirrors that are bent to the desired parabolic curve shape. In other embodiments, reflectors 1002 may comprise a plurality of flat elongated mirrors that are coupled into a parabolic shape, such as that shown in FIGS. 10A and 11. The curvature of reflectors 1002 is such that the concentrated light from a reflector 1002 fully illuminates the width 1053 of one or more receivers 1004 with a minimum of concentrated light being spilled off the sides of the one or more receivers 1004 over the course of a day.

In some embodiments, receivers 1004 may comprise of a photovoltaic panel with a heat exchanger tube located behind the panel to recover excess heat to heat a fluid, such as in receiver 104-A. As previously described, the fluid may be water, a glycol, an alcohol, a hydrocarbon, or any other liquid. In some embodiments, one receiver 1004 could be used to heat the fluid. In further embodiments, a number of receivers could be used in series to heat a fluid. For example, four receivers 1004 may be ganged together, as shown in FIGS. 10A and 10B. In some embodiments, piping system 1012 is used to convey fluid between the receivers 1004. The fluid may enter the system at a piping entrance 1111 and exit at a piping exit at 1010 where the piping would be connected to a fluid process, such as a building hot water system.

FIGS. 11A-11C illustrate another view of the parabolic trough solar collector 1000, in accordance with one or more embodiments. FIGS. 11A-11C depict a view of solar collector 1000 from the A-A viewpoint shown in FIG. 10B. The A-A viewpoint is end-on view, looking away from the equator, e.g., North, and aligned with reflectors 1002 and receivers 1004. As shown in FIGS. 11A-11C, structural and piping components, such as frame structure 1006 and support structure 1008, are omitted for clarity. As shown, reflectors 1002 include a curved parabolic shape, previously described above.

FIGS. 11A-11C each show reflectors 1002 rotated in different positions to track the sun throughout a day. In FIG. 11A, it may be after noon, and the sun is to the west (or to the left side of FIG. 11A). In FIG. 11B, it may be noon, and the sun is due south (for example, at a site in the northern hemisphere). In FIG. 11C, it may be morning, and the sun is to the east (or to the right side of FIG. 11C). As shown in FIGS. 11A-C, example sun rays 1101 may hit reflectors 1002, and the reflected sun ray 1102 is redirected toward receivers 1004. In some embodiments, connecting rod 1104 connects multiple reflectors 1002 so they rotate together. An arm 1106 may couple the connecting rod to a reflector 1002. In some embodiments, the assembly of reflector 1002 and arm 1106 rotates about pivot point 1108 when arm 1106 is pushed by connecting rod 1104. Each pivot point 1008 may be aligned with an axis 1014. In some embodiments, reflectors 1002 are attached to frame structure 1006, shown in FIGS. 10A and 10B, by a hinge or bearing (not shown) at pivot points 1108.

In some embodiments, movement of reflectors 1002 are controlled by the same or similar processes and mechanisms as described with reference to primary reflectors 102. For example, reflectors 1002 may be rotated at a constant speed throughout the day to track the position of the sun. Furthermore, reflectors 1002 may be automatically rotated based on time data, astronomical data, and/or location data. A light sensor which may be operable to detect the source of light relative to the sensor (and thus, relative to solar collector 1000) may also be included to determine the optimal rotation position for reflectors 1002.

In the embodiment shown in FIGS. 11A-C, a linear actuator 1110 drives the connecting rod to move reflectors 1002. Alternatively, in some embodiments, reflectors 1002 may be rotated with motors, pneumatics, hydraulics, or another powered means. In embodiments in which reflectors 1002 move at a constant speed, they could be driven by a simple mechanical system powered by a spring, similar to a mechanical clock or a wind-up toy, by gravity-driven system, or by another simple mechanical energy storage system. Reflectors 1002 may also be driven manually. Reflectors could be actuated individually or together with connecting rod 1104, as shown, or with another connector mechanism, such as a chain drive.

Figure 12:
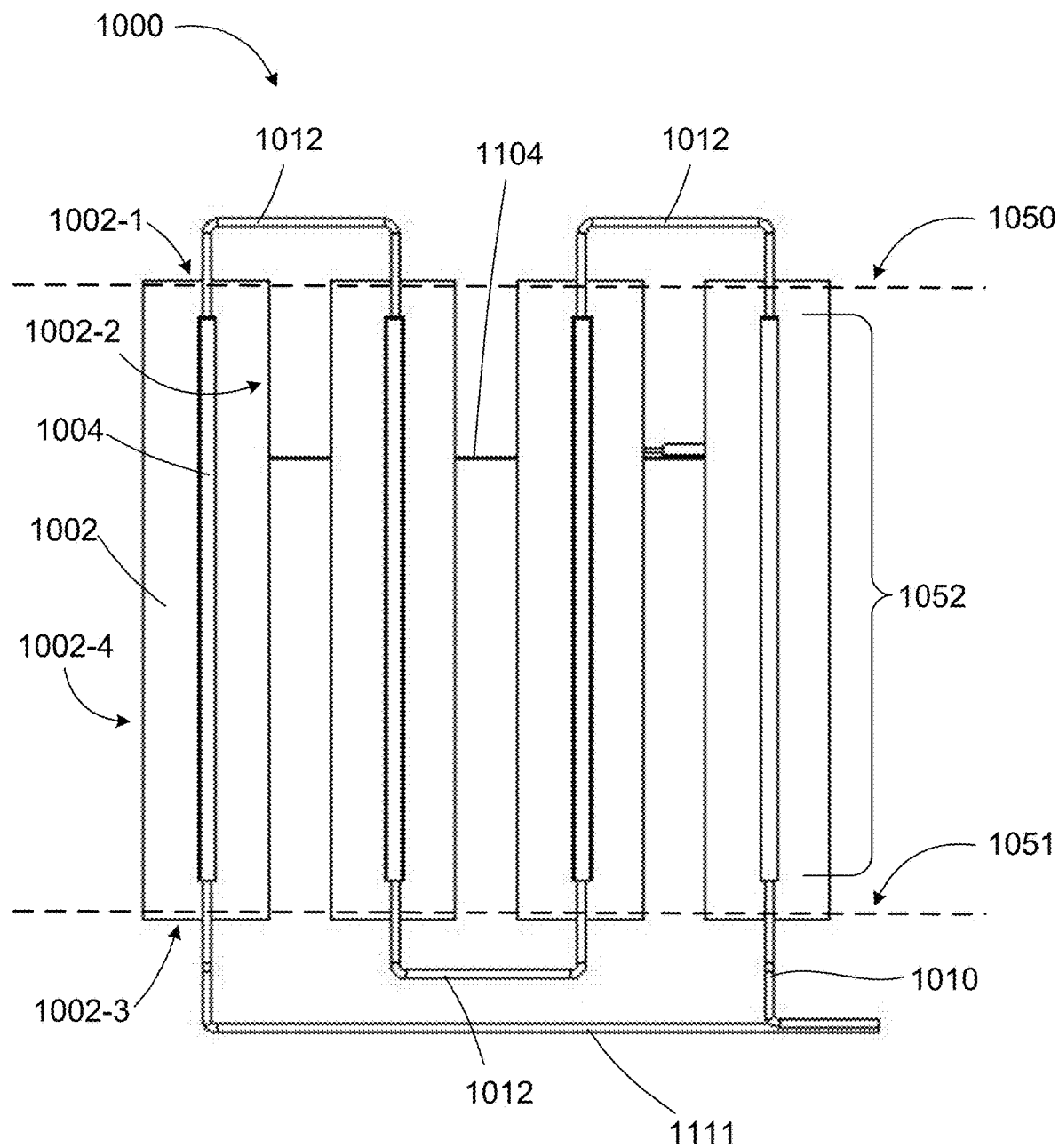
FIG. 12 illustrates yet another view of the parabolic trough solar collector, in accordance to one or more embodiments.

FIG. 12 illustrates another view of the parabolic trough solar collector 1000, in accordance to one or more embodiments. FIG. 12 depicts a view of solar collector from the B-B viewpoint shown in FIG. 10B, facing reflectors 1002. Structural components have been omitted in FIG. 12 for clarity. As previously described, solar collector 1000 may be tilted at an angle equal to the latitude angle of a hypothetical project site's location. In some embodiments reflectors 1002 are longer than receivers 1004, and receivers 1004 are centered lengthwise along reflectors 1002. In some embodiments, a single receiver 1004 is centered along one reflector 1002. However, in other embodiments, more than one receiver 1004 may be centered along reflectors 1002.

In an example embodiment, a receiver 1004 may be set approximately 0.4 m distance from a corresponding reflector 1002. As shown in FIG. 12, receivers 1004 are shorter and narrower than reflectors 1002. Reflectors 1002 may be approximately 0.5 m wide and approximately 11 times wider than receivers 1004. In various embodiments, this ratio may be reduced or significantly increased depending on optimization of the cost of different components, of the optical accuracy of the system, and/or of the desired operating temperature of receivers 1004. A higher ratio may result in more incident light for a given receiver size and therefore more energy output for a fixed area for heat loss, which improves efficiency. A higher ratio may also require higher aiming accuracy of a reflector 1002 and/or a larger distance between the reflector 1002 and corresponding receiver 1004.

During the winter solstice, the sun may be low in the sky, and sun rays hitting the lower-most edge 1051 of a reflector 1002 (the bottom side of the view in FIG. 12) will hit the lower-most end of a corresponding receiver 1004. Sun rays hitting the upper-most edge of the reflector will not hit the receiver. In some embodiments, this may be an accepted loss of energy. During the summer solstice, the sun may be high in the sky. Light rays hitting the upper-most edge 1050 of a reflector 1002 (top side of the view in FIG. 12), will be reflected to the upper-most end of the receiver 104. Since the sun is at its most extreme positions at the winter and summer solstices, light will be reflected on the entire length 1052 of receivers 1004 for every day of the year in the embodiment depicted in FIG. 12. If another tilt angle were chosen, a different reflector 1004 length and relative position lengthwise may need to be chosen so that receivers 1004 are fully illuminated throughout the year. Further examples of incident angles of light rays are discussed with reference to FIGS. 14A-C and 15A-C below.

Figure 13A:
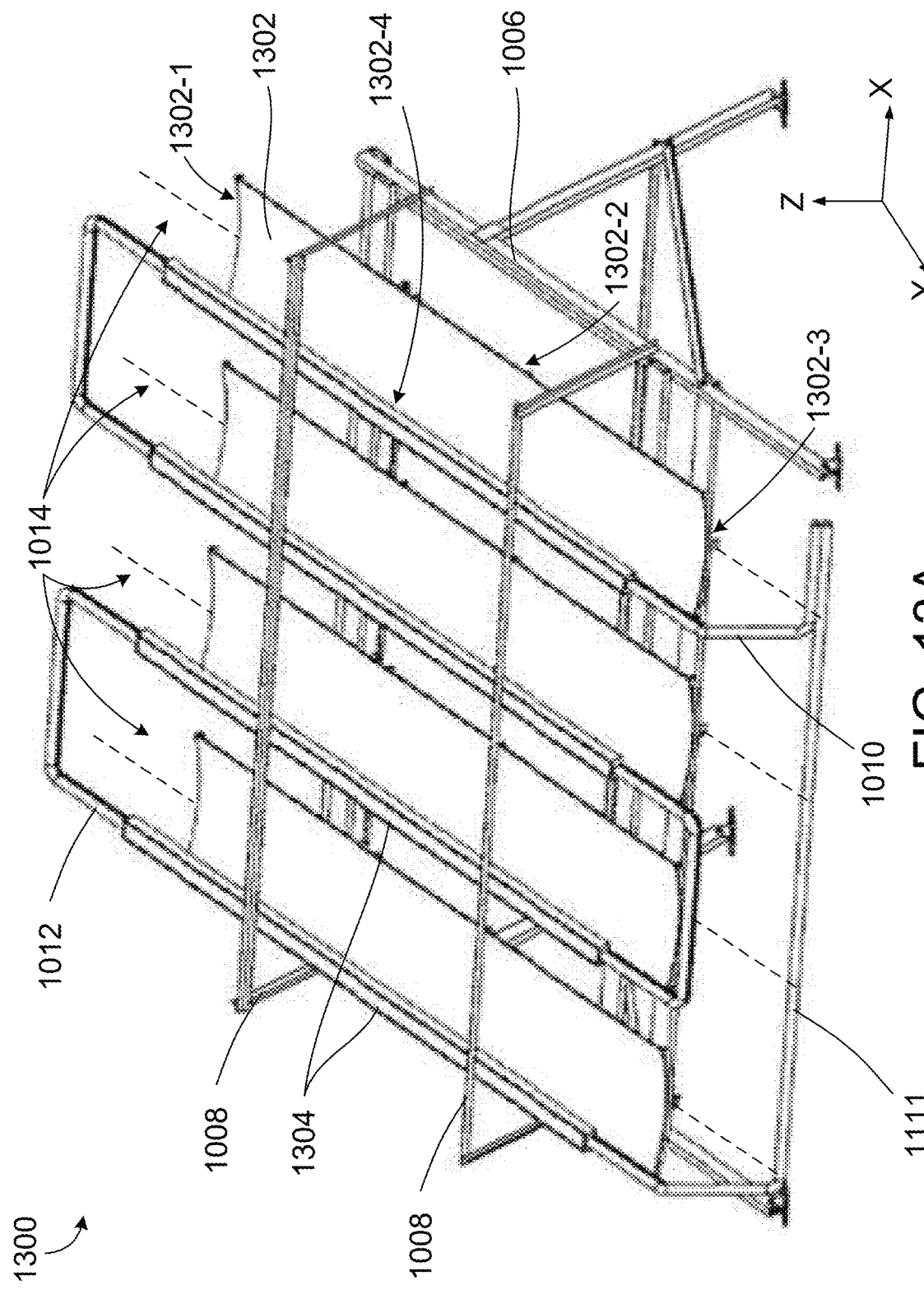
FIG. 13A shows a perspective view of a parabolic trough solar collector that includes reflectors and receivers of equal length.
Figure 13B:
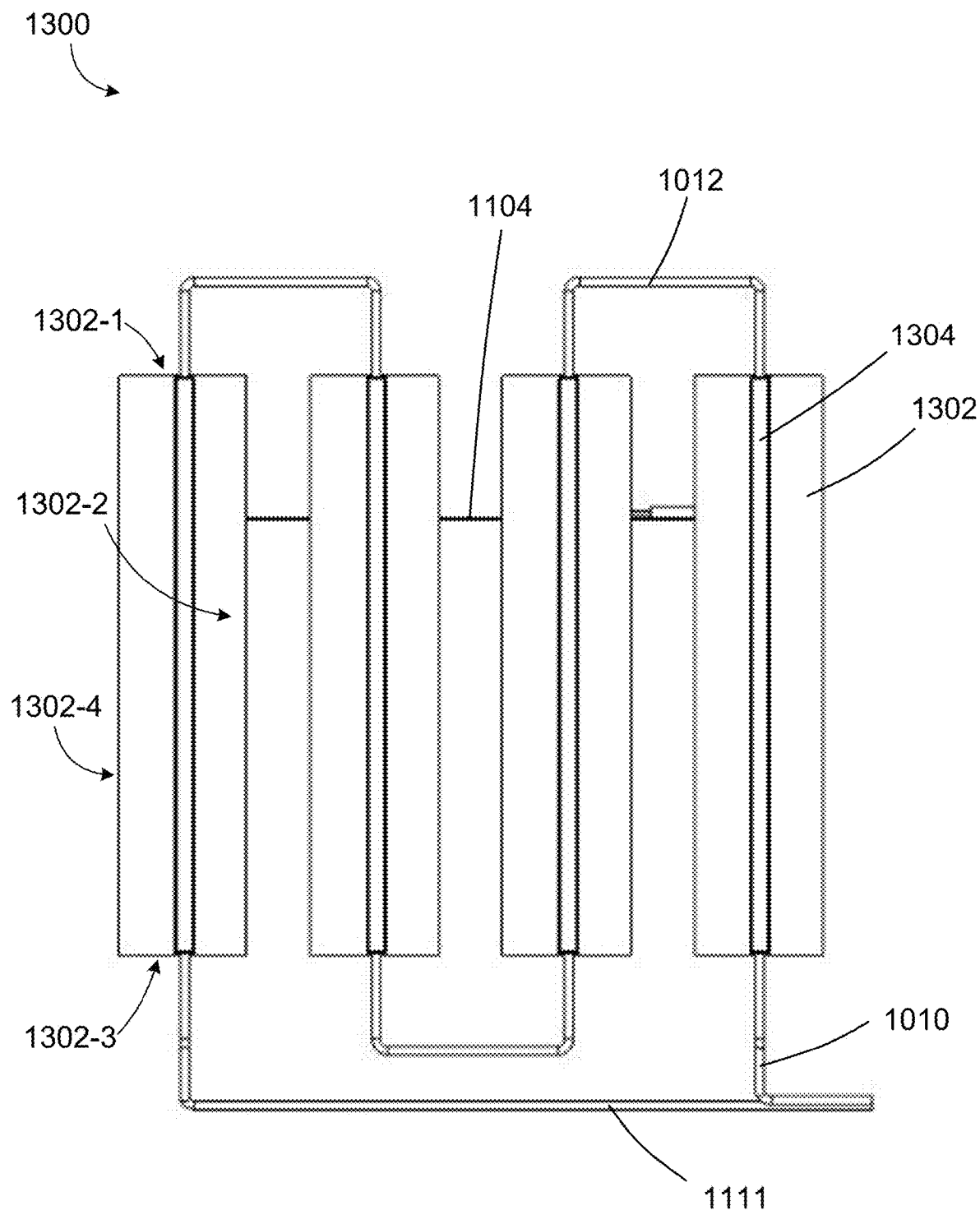
FIG. 13B illustrates another view of the parabolic trough solar collector that includes receivers and reflectors of equal length, in accordance to one or more embodiments.

FIGS. 13A, 13B, 14, and 15 illustrate another embodiment of a parabolic trough solar collector 1300 that includes receivers and reflectors of equal length. FIG. 13A shows a perspective view of a parabolic trough solar collector 1300 that includes reflectors 1302 and receivers 1304 of approximately equal length. FIG. 13B illustrates another view of the parabolic trough solar collector 1300 that includes receivers and reflectors of approximately equal length, in accordance to one or more embodiments. FIG. 13B depicts a view of solar collector similar to the B-B viewpoint shown in FIG. 10B, facing reflectors 1302. Such viewpoint is perpendicular to reflectors 1302. Structural components in FIG. 13B are omitted for clarity. As show in FIG. 13B, reflectors 1302 are approximately the same length 1053 as receivers 1304. In some embodiments, reflectors 1302 may be shorter than reflectors 1002 shown in FIG. 10. For example, reflectors 1302 may be reflectors 1002 with shorter edges 1302-2 and 1302-4 (edges 1302-1 and 1302-3 may be the same length as edges 1002-1 and 1002-3). Thus, less mirror area may be used resulting in less material required for reflectors 1302. Alternatively, and/or additionally, receivers 1304 may be longer than receivers 1004 shown in FIG. 10. Solar collector 1300 may further include frame structure 1006, support structure 1008, and a piping system 1012 with piping entrance 1111 and piping exit 1010. Similar to reflectors 1002, each reflector 1302 may also rotate about an axis 1014.

Figure 14A:
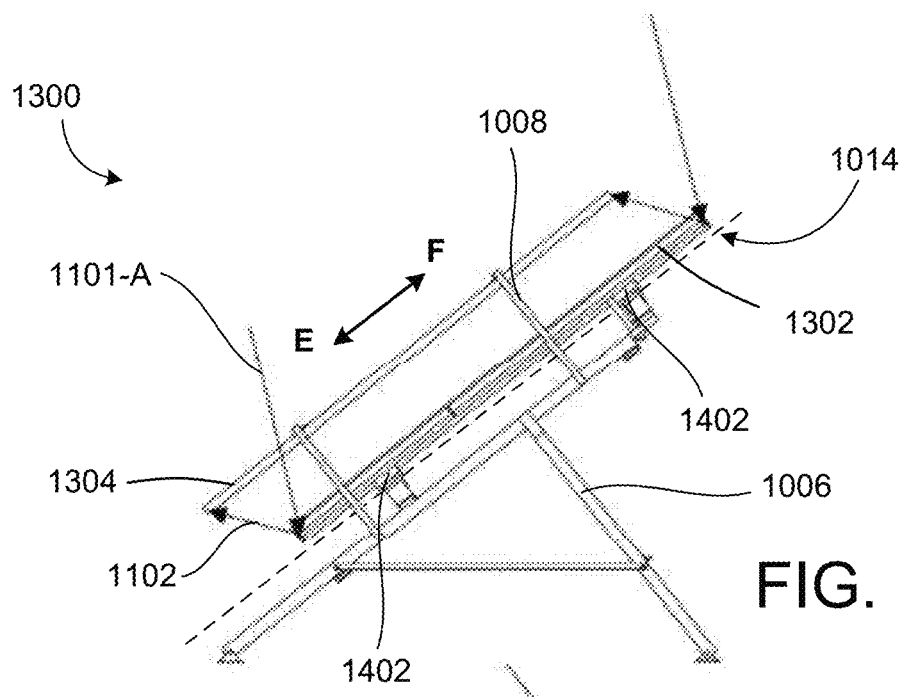
FIGS. 14A-14C illustrate an example of a parabolic trough solar collector with translating reflectors, in accordance to one or more embodiments.
Figure 14B:
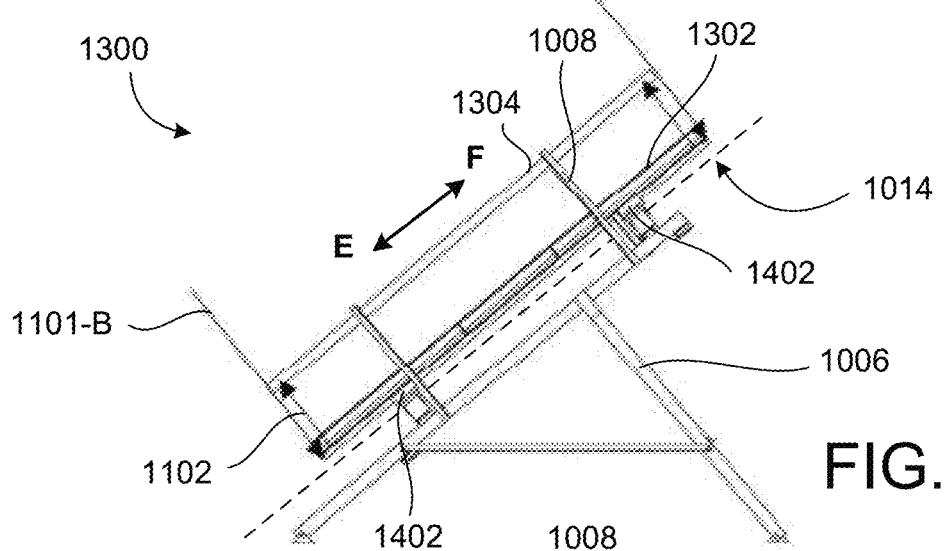
Figure 14C:
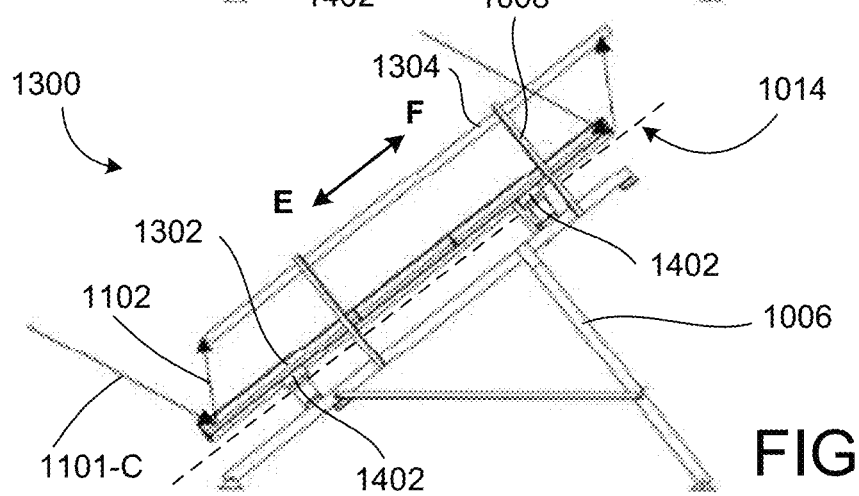

FIGS. 14A-14C illustrate an example of a parabolic trough solar collector 1300 with translating reflectors 1302, in accordance to one or more embodiments. FIGS. 14A-14C may depict a similar side view as depicted in FIG. 10B. As shown in FIGS. 14A-14C, reflectors 1302 are on a carriage 1402. In some embodiments, carriage 1402 may include connecting rod 1104, arm 1106, pivot point 1008, and actuator 1110. Carriage 1402 may allow translational movement of reflectors 1002 in addition to rotational movement described with reference to FIGS. 11A-11C.

In various embodiments, carriage 1402 translates in directions of arrows E and F, parallel to the axes of rotation 1014 of reflectors 1302. In some embodiments, carriage 1402 may translate along a track or rail system on frame structure 1006 similar to travelers 806 which move along frame structure 106 on two rails 704 that are mounted on frame structure 106, as described with reference to FIG. 8. Actuation for the movement of carriage 1402 may be powered by motors, pneumatics, hydraulics, or another powered mechanism. In further embodiments, movement of carriage 1402 may be performed manually, by spring-drive, by gravity-driven adjustment, or by a combination of the aforementioned methods.

In some embodiments, reflectors 1302 and carriage 1402 slide to accommodate the changing path of the sun through the seasons of the year. For example, FIG. 14A depicts positioning for the summer solstice when the sun is highest in the sky. Carriage 1402 may cause reflectors 1302 to translate toward direction F. As such, sun rays 1101-A, which hit reflector 1302 at a higher incidence angle, may be reflected by reflector 1302 so that receiver 1304 is fully illuminated by reflected sun rays 1102. FIG. 14B depicts positioning for the spring and autumnal equinoxes, during which, the plane of Earth's equator passes through the center of the Sun. Thus, sun rays 1101-B in FIG. 14B may hit reflector 1302 at an incidence angle equal to the tilt angle of reflectors 1302. As such, carriage 1402 may cause reflectors 1302 to translate such that they are directly aligned with receivers 1304, as shown in FIG. 14B, so that a direct beam of sun ray 1101-B may hit reflector 1302 and be reflected to receiver 1304. FIG. 14C depicts positioning for the winter solstice, when the sun is low in the sky. Carriage 1402 may cause reflectors 1302 to translate toward direction E. As such, sun rays 1101-C, which hit reflector 1302 and a lower incidence angle, may be reflected by reflector 1302 so that receiver 1304 is fully illuminated by reflected sun rays 1102.

The translation of carriage 1402 and reflectors 1302 may be very slow. For example, carriage 1402 and reflectors 1302 may only move a few centimeters per week for a full round trip travel once per year. In some embodiments, the distance between a reflector 1302 and receiver 1304 is approximately 0.6 m, and the travel distance of the reflectors 1302 and carriage 1402 is approximately 0.5 m from winter to summer solstice.

Figure 15A:
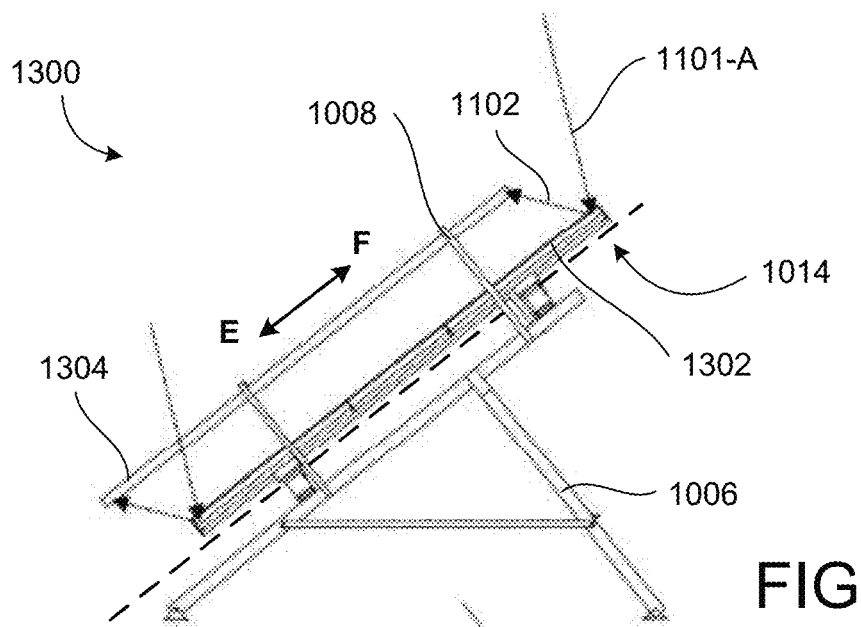
FIGS. 15A-15C illustrate an example of a parabolic trough solar collector with translating receivers, in accordance to one or more embodiments.
Figure 15B:
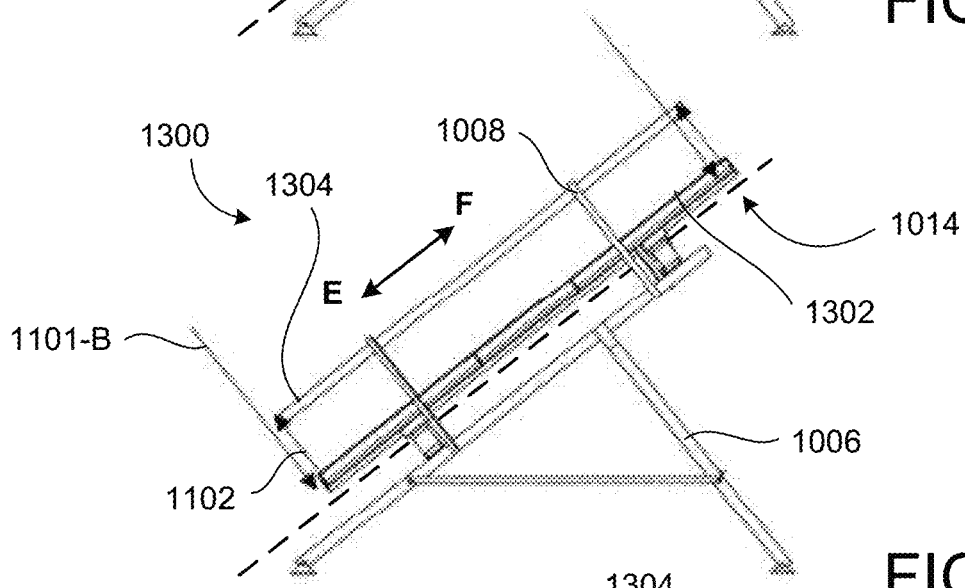
Figure 15C:
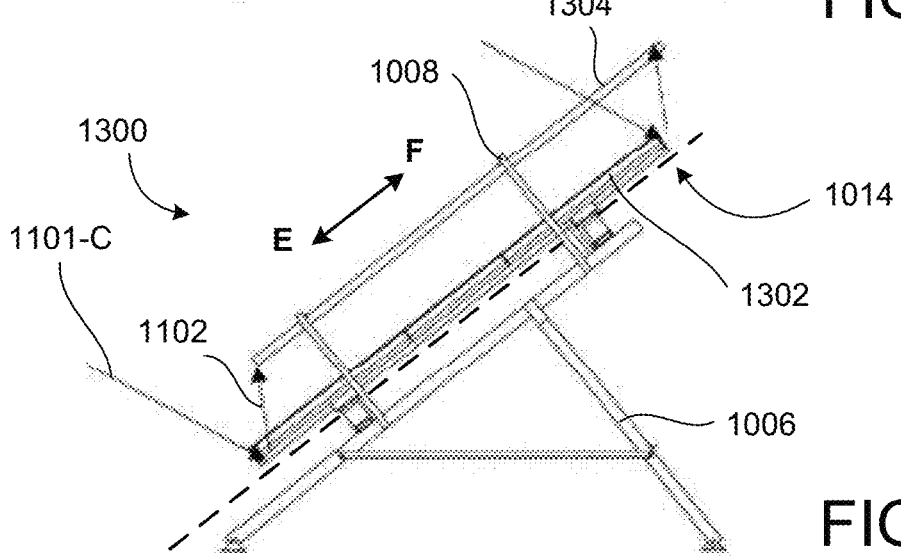

In some embodiments, receivers 1304 may translate in directions E and F. FIGS. 15A-15C illustrate an example of a parabolic trough solar collector 1300 with translating receivers 1304, in accordance to one or more embodiments. As previously described, receivers 1304 may be approximately the same length as reflectors 1302. In some embodiments, reflectors 1302 do not translate. Instead, receivers 1304 translate lengthwise relative to the reflectors in the direction of arrows E and F to accommodate for the changing path of the sun through the seasons. In some embodiments, such translation of receivers 1304 may be caused by mechanisms on support structure 1008. As such, receivers 1304 may translate along with support structure 1008 relative to frame structure 1006. In other embodiments, receivers 1304 may translate relative to support structure 1008 and frame structure 1006. In various embodiments, receivers 1304 could be moved with a variety of methods, such as described with reference to movement of carriage 1402 in FIGS. 14A-14C.

In some embodiments, receivers 1304 slide to accommodate the changing path of the sun through the seasons of the year. For example, FIG. 15A depicts positioning of receivers 1304 for the summer solstice when the sun is highest in the sky. In some embodiments, receivers translate in the direction of arrow E such that sun rays 1101-A, which hit reflector 1302 at a higher incidence angle, may be reflected by reflector 1302 so that receiver 1304 is fully illuminated by reflected sun rays 1102. FIG. 15B depicts positioning of receivers 1304 for spring and autumnal equinoxes, during which, the plane of Earth's equator passes through the center of the Sun. Thus, sun rays 1101-B in FIG. 15B may hit reflector 1302 at an incidence angle equal to the tilt angle of reflectors 1302. As such, receivers 1304 may translate such that they are directly aligned with receivers 1304, as shown in FIG. 15B, so that a direct beam of sun ray 1101-B may hit reflector 1302 and be reflected to receiver 1304. FIG. 15C depicts positioning of receivers 1304 for the winter solstice, when the sun is low in the sky. Receivers 1304 may translate toward the direction of arrow E. As such, sun rays 1101-C, which hit reflector 1302 and a lower incidence angle, may be reflected by reflector 1302 so that receiver 1304 is fully illuminated by reflected sun rays 1102. As previously described with reference to translation of receivers 104, the optimal translation position of the receivers 1304 may be automatically determined and/or controlled based on time data, astronomical data, location data (such as GPS), and/or various sensors.

Translating the receivers 1304 may be an alternative means for achieving full illumination of the receivers 1304 while shortening reflectors 1302 to be the same length as receivers 1304. In some embodiments, other structures may translate along with receivers 1304, such as piping system 1012. By implementing a tracking mechanism, as described with reference to FIGS. 14A-14C and FIGS. 15A-15C, smaller reflectors 1302 may be used, reducing the mirror area required. This may result in cost savings and/or an overall reduction in size of solar collector 1300. However, only moving reflectors 1302 on carriage 1402 may allow receivers 1304, and thus, piping system 1012 to remain stationary, which may reduce the amount of parts and construction costs. In other embodiments, receivers 1304 may translate without causing structures in piping system 1012 to move. For example, in embodiments, where a receiver, such as receiver 104-C (shown in FIG. 6) is implemented, receiver 104-C may not be in direct contact with heat transfer tube 610 and may translate while heat transfer tube 610 remains stationary. In other aspects, receivers 1304 may slide relative to the structures of piping system 1012 while the heat transfer tube, such as 410 and/or 1613, remains in good thermal contact with PV panels 406 and/or 1611, respectively, such as via conductive plate 408 and/or 1625. In such examples, a heat transfer tube may extend out from either end of a receiver 1304.

Figure 16A:
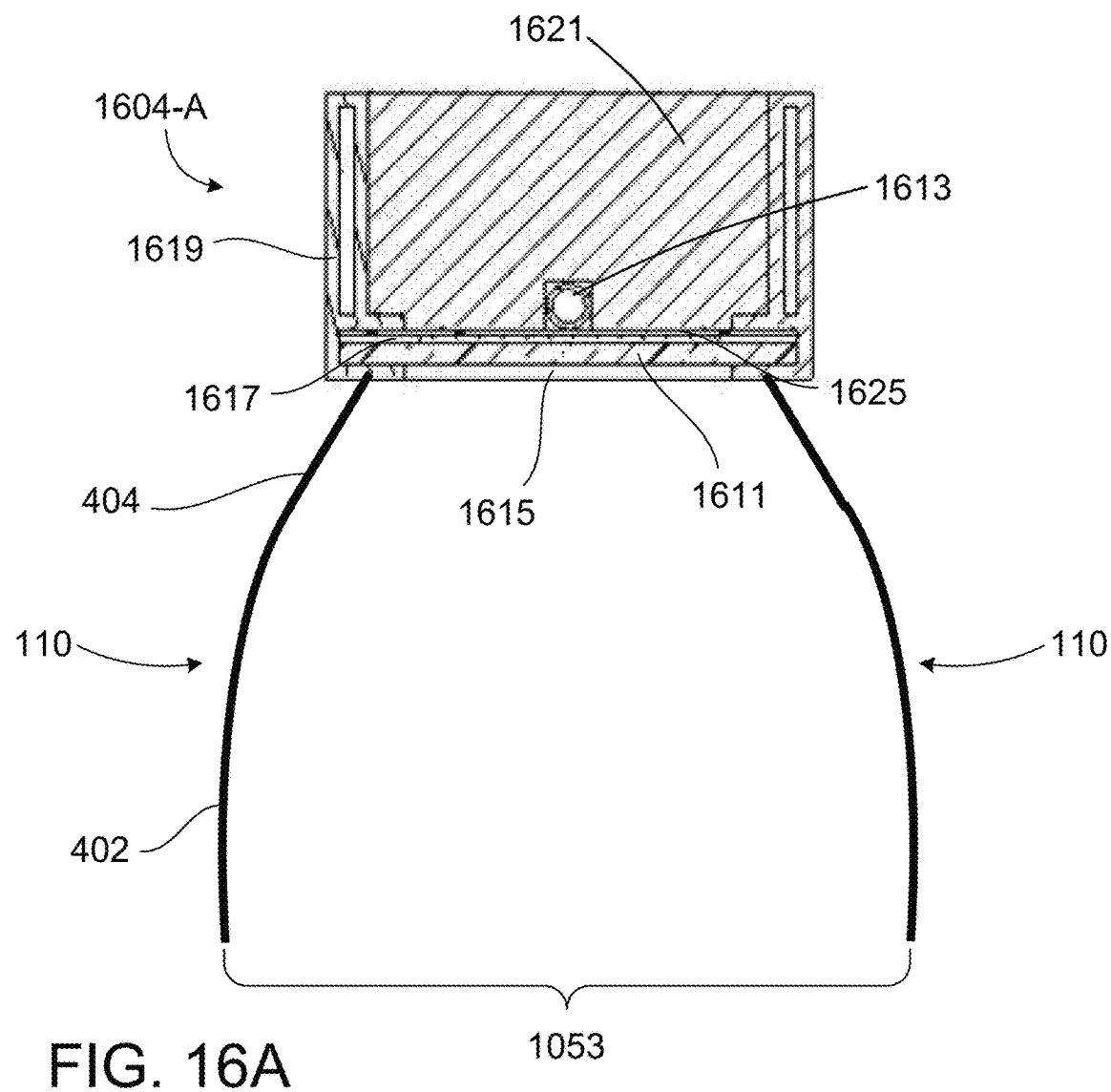
FIG. 16A illustrates a detailed end-on views of a fourth embodiment of a receiver assembly.
Figure 16B:
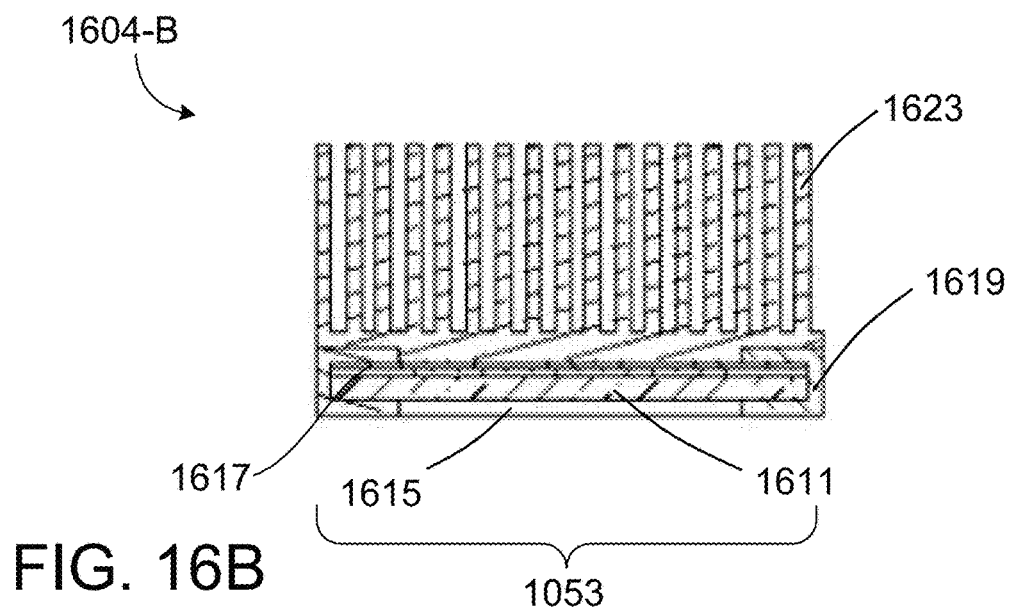
FIG. 16B illustrates a detailed end-on views of a fifth embodiment of a receiver assembly.

As previously described, receivers 1004 and/or 1304 may be receiver 104, including one or more of the embodiments described above, such as with reference to FIGS. 4, 5, and 6. FIGS. 16A and 16B illustrate detailed end-on views of fourth and fifth embodiments of a receiver assembly, respectively. In various embodiments, receivers 1004 and/or 1304 may be comprise receiver assembly 1600-A and/or 1600-B, described herein. FIG. 16A shows a detailed, cross-section view of a receiver assembly 1604-A. In some embodiments, receiver 1600-A may be receiver 1004 and/or receiver 1304. As shown in FIG. 16A, receiver 1604-A may generate electricity with photovoltaic (PV) cells 1611 and heats a fluid within heat transfer tube 1613. In various embodiments, PV cells 1611 may be PV cells 406. In various embodiments, heat transfer tube 1613 may be heat transfer tube 410. As shown in FIG. 10A, receiver assembly 1600-A includes one heat transfer tube 1613. However, in some embodiments, receiver assembly 1600-A may include any number of heat transfer tubes 1613.

Reflected light from reflectors 1002 and/or 1302 may be concentrated on PV cells 1611 through glass cover 1615 at the bottom of receiver 1604-A. In some embodiments, glass cover 1615 prevents water ingress onto PV cells 1611 on the front, and encapsulant 1617 protects PV cells 1611 in the rear. The assembly is held together structurally with a metal frame 1619. In various embodiments, insulation 1621 reduces heat loss from heat transfer tube 1613. In various embodiments, insulation 1621 may be insulation 412.

FIG. 16B shows a detailed, cross-section view of a receiver assembly 1604-B. In some embodiments, receiver 1600-B may be receiver 1004 and/or receiver 1304. As shown in FIG. 16B, receiver 1604-B may only generate electricity with photovoltaic cells 1611. In some embodiments, glass cover 1615 and an encapsulate 1617 may protect PV cells 1611 in the front and rear, respectively. A metal frame 1619 may provide structural support for the assembly. When illuminated by light concentrated by reflectors 1002 and/or 1302, PV cells 1611 may generate significant excess heat. In some embodiments, a fin heat sink 1623 may be included to help dissipate excess heat to the ambient air. In such embodiments, no heat transfer tubing 1613 or other connector piping would be included. In various embodiments, fin heat sinks 1623 may be fin heat sink 504. In some embodiments, a conductive plate 1625 enables good thermal contact between the PV cells 1611 and heat transfer tube 1613 and/or heat sink fins 1623. In some embodiments, conductive plate 1625 may be conductive plate 408.

Additionally receivers 1004 and/or 1304 may include secondary concentrators, such as secondary concentrators 110, described with reference to FIGS. 4, 5, and 6. Although receiver assemblies in various embodiments, may function without such secondary concentrators. As previously described, secondary concentrators 110 may each comprise two segments, including a parabolic shaped mirror segment 402 nearer to the opening 420, and a flat mirror segment 404 located between the parabolic shaped segment 402 and photovoltaic panel 1611. Such secondary concentrators 110 may redirect at least some of the light reflected by reflectors 1002 and/or 1302, to heat a transfer tube, such as 410, 610, or 1613, and/or to generate electricity at PV cells 1611. Such secondary concentrators 110, may serve to provide a wider target for the reflected light from primary reflectors 1002 and/or 1302. Secondary concentrators 110 may also serve to flatten the distribution of concentrated solar flux on photovoltaic panel 406.

As described herein, solar collectors 1000 and/or 1300 may provide various advantages, such as the following, without limitation. Such solar collector 100 and/or 1300 is configured to generate a more uniform seasonal energy output profile at lower costs than existing systems and devices. Compared with existing non-concentrating systems, expensive photovoltaic panel area is much reduced and replaced with inexpensive reflector area. For applications where a fluid is heated, heat loss to the environment, as well as the required length of piping, are also much reduced in the disclosed embodiments, as compared to existing non-concentrating systems. Additionally, the weight of the disclosed systems may be further reduced because smaller PV panels may be used; because the mirrors used in reflectors 1002 and/or 1302 weigh less than PV panels, the weight of the disclosed systems may be much less than existing equivalent PV panels or solar hot water systems that do not concentrate sunlight.

The systems and apparatus disclosed herein may also result in lower cost and better performance than existing systems that may utilize parabolic trough concentrators. The reflectors, such as 1002 and/or 1302 are nearly flat, and as such, may be fabricated by bending flat mirrors to shape. This may be much less expensive than the fabrication of current curved mirrors. Furthermore, receivers 1004 and/or 1304, and associated piping 1012, in the disclosed embodiments may not rotate with reflectors 1002 and/or 1302, thereby greatly simplifying their design. By tilting the reflectors toward the equator, year-round full illumination on the receiver can be achieved to provide a significantly more even seasonal output than a collector that is parallel to the ground.

Furthermore, there is a significant increase in collected solar energy per unit land as compared to existing parabolic trough solar collectors. For example, reflectors may be spaced closer together, thereby reducing the amount of space required for a solar collector 1000 and/or 1300. In the disclosed embodiments, where only the reflector rotates, the reflector may be aimed halfway between the receiver and the sun. In existing parabolic trough designs, the reflector and receiver rotate together, and they both point at the sun. In the disclosed embodiments, the rotation of the reflector throughout the day is half, compared with the standard parabolic trough designs. As a result, the reflectors in the disclosed embodiments may be spaced much closer together without one reflector shading a neighboring reflector. By spacing the reflectors closer together and by rotating them only half as much as existing parabolic trough systems, the structure also becomes smaller and simpler and therefore cheaper.

Additionally, as previously described, the tracking mechanism can be simple since the primary reflectors may all rotate at the same speed and, if tilted at the latitude angle, rotate at a constant speed through the day. By including reflectors 1002 that are longer than receivers 1004, no other components of solar reflector 1000 may need to be moved or adjusted. However, in embodiments where reflectors 1302 and receivers 1304 are of approximately the same length, translation of receivers 1304 may allow solar collector 1300 to be positioned at a fixed tilt angle throughout the year. This eliminates the need to drastically alter the tilt angle through the day to compensate for the movement of the sun. Such translating receivers 1304 may also compensate for less precise tilt angles. Such tracking mechanism may be performed by a simple mechanical energy storage system without electrical power, such as a spring, gravity-driven system, etc. However, the tracking mechanism may also be automated and implement wireless and GPS technologies to accurately determine the optimal angle to tilt solar collector 1000 and/or 1300, the optimal rotation for each primary reflector 1002 and/or 1302, and/or the optimal translation position for receiver assembly 1004 and/or 1304.

Existing systems utilizing parabolic trough reflectors are not typically tilted toward the equator because such configuration is too expensive, and because the receiver would not be properly illuminated when the sun is high or low in the sky. The disclosed embodiments address both problems by making the reflectors lighter and closer together, as well as by oversizing the reflector, and/or by sliding the receiver and/or the reflector. Efficiency of such systems may be quantified by solar energy in per unit reflector area. Thus, more mirror area may be required. However, even if there may be an efficiency loss relative to existing parabolic trough systems the various advantages described above may negate such tradeoff.

Figure 17A:
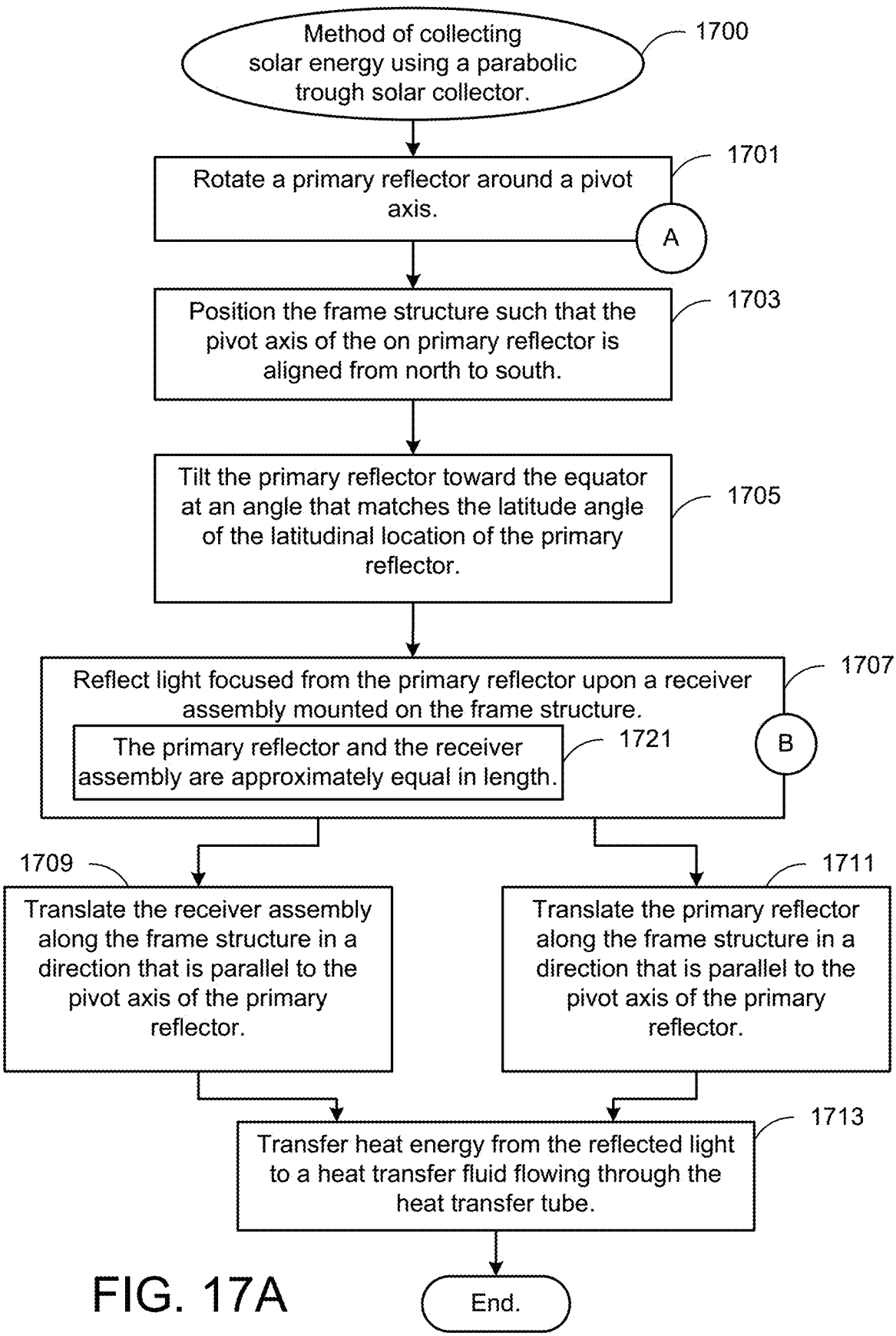

FIGS. 17A and 17B illustrate an example method 1700 of collecting solar energy using a parabolic trough solar collector, in accordance with one or more embodiments. At step 1701, a primary reflector 1715 is rotated around a pivot axis. In some embodiments, each primary reflector 1715 comprises an elongated curved mirror mounted on a structural backing that is rotatably coupled to a frame structure such that each primary reflector 1715 may rotate about the pivot axis. In some embodiments, the frame structure may be frame structure 1006 and the pivot axis may be pivot axis 1014. In some embodiments, primary reflector 1715 may be primary reflector 1002 and/or 1302, the configurations of which are described with reference to FIGS. 10A-10B, 11A-C, 12, and 13A-B.

In some embodiments, the primary reflector 1715 may be rotated at a constant speed 1717 based on the location of the sun. For example, the rotation of the primary reflector 1717 about the pivot axis may track the position of the sun through the day. In various embodiments, this may provide the optimal angle for reflection of sunlight from the primary reflector 1715 to a receiver assembly, such as 1004 and/or 1304. The rotation position of a primary reflector 1717 about a pivot axis may depend on the position of the primary reflector 1717 relative to the receiver assembly.

In some embodiments, the primary reflector 1715 is rotated by mechanical means 1719. As previously described, such mechanical means 1719 may comprise an electric motor, a pneumatic system, a hydraulic system, a manual system, or other actuation system. Such mechanical means 1719 may alternatively comprise a simple mechanical system powered by a spring, similar to a mechanical clock or a wind-up toy, by gravity-driven system, or by another simple mechanical energy storage system. As previously described, such rotation position of primary reflectors 1715 may be automatically determined by time data, astronomical data, and/or location data (such as GPS).

Additional steps may be performed to further optimize the amount of light reflected upon a receiver assembly. At step 1703 the frame structure is positioned such that the pivot axis of the primary reflector 1715 is aligned from north to south. This may align the pivot axis such that the primary reflector 1715 is able to track the location of the sun by rotating about the pivot axes as described in step 1701. At step 1705, the primary reflector 1715 may be tilted toward the equator at an angle that matches the latitude angle of the latitudinal location of the primary reflector 1715. As previously described, tilting the primary reflector 1715 toward the equator to match the latitude angle may further increase the amount of sunlight reflected by the primary reflector 1715. However, in other embodiments, the tilt angle does not need to match the latitude angle and may be tilted as low as 0° to higher than 60°.

At step 1707, light focused from the primary reflector 1715 is reflected upon a receiver assembly 1721 mounted on the frame structure. In some embodiments the receiver assembly 1721 may be receiver assembly 1004 and/or 1304, or any other receiver assembly previously described above (such as 104, 104-A, 104-B, 104-C, 1600-A, or 1600-B). In some embodiments, the receiver assembly 1721 may comprise one or more secondary concentrators 1723, such as described in FIGS. 4-6. In some embodiments secondary concentrators 1723 may be secondary concentrators 110. The receiver assembly may also comprise a heat transfer tube 1725. In some embodiments, heat transfer tube 1725 may be heat transfer tube 410, 610, and/or 1613.

In some embodiments, the receiver assembly 1721 may further comprise a photovoltaic panel 1727 coupled to the heat transfer tube 1725 by a conductive plate 1729. In some embodiments, photovoltaic panel 1727 may be photovoltaic panel 406 and/or 1611, and conductive plate 1729 may be conductive plate 408. In some embodiments, the conductive plate 1729 and the heat transfer tube 1725 may be enclosed in a thermally insular material, such as insulation 412 and/or 1621. In some embodiments, the photovoltaic panel 1727 may also be partially or entirely enclosed in the thermally insular material. In some embodiments configured for electricity generation only, such as receiver assembly 104-B and/or 1604-B, the receiver assembly may not comprise a heat transfer tube 1725. Instead, such embodiments of the receiver assembly may comprise heat sinks, such as fin heat sinks 504 and/or 1623.

In various embodiments, the receiver assembly 1721 of solar collector device 1000 and/or 1300 may be configured for heat generation only, such as described in FIG. 6. In such embodiments, the heat transfer tube 1725 may be positioned at the center 1731 of the receiver assembly 1721 and the secondary concentrators 1723 are positioned around the heat transfer tube 1725 opposite the primary reflector 1715. In further embodiments, a transparent outer tube 1735, such as transparent tube 604, may be located around the heat transfer tube 1725, such that an annular space is formed between the outer tube 1735 and the heat transfer tube 1725. In some embodiments, the transparent outer tube 1735 allows light to penetrate through to heat the heat transfer tube 1725 while working to trap heat within the annular space. In some embodiments, the annular space may be evacuated to create a vacuum between the heat transfer tube 1725 and the outer tube 1735, thereby decreasing potential heat loss from the heat transfer tube 1725. In various embodiments, the receiver assembly may comprise any combination of one or more of the following: secondary concentrators 1723, heat transfer tube 1725, photovoltaic panel 1727, conductive plate 1729, and insular material.

In certain embodiments, the primary reflector 1715 and the receiver assembly 1721 are approximately equal in length, such as described with reference to solar collector 1300. In such embodiments translation of primary reflector 1715, receiver assembly 1721, or both may be required to ensure that receiver assembly 1721 is fully illuminated by light reflected from primary reflector 1715 throughout the year.

At step 1709, the receiver assembly 1721 is translated along the frame structure in a direction that is parallel to the pivot axis of the primary reflector 1715, such as previously described with reference to FIGS. 15A-C. Alternatively, and/or additionally, the primary reflector 1715 is translated along the frame structure in a direction that is parallel to the pivot axis of the primary reflector 1715 at step 1711, such as previously described with reference to FIGS. 14A-C. Steps 1709 and 1711 may be performed to further optimize the amount of light reflected upon a receiver assembly 1721. As previously described, translation position of the primary reflector 1715 and/or the receiver assembly 1721 may be automatically determined by time data, astronomical data, location data (such as GPS), and/or various other sensors.

At step 1713, heat energy from the reflected light is transferred to a heat transfer fluid flowing through the heat transfer tube 1725. As previously described, the temperature of the heat transfer fluid may rise up to well over 200° C. In some embodiments, the maximum temperature generated may be limited by the construction of the photovoltaic panels 1727, as the efficiency of photovoltaic cells in a photovoltaic panel 1727 may decrease as temperature increases beyond a certain threshold. For example, a particular PV panel 1727 may be rated to function at a max temperature of 85° Celsius.

In some embodiments, temperatures of 80° Celsius to 85° Celsius may be adequate to heat water for residential or commercial usage, desalination, industrial processes, and/or water treatment. However, in embodiments of solar collector 1000 and/or 1300 that are configured for heat generation only, there may be no such limit to the maximum temperature that can be reached. In some embodiments, heat generated by solar collector 1000 and/or 1300 may be used for steam generation. In other embodiments, other fluids may be heated for various commercial uses, such as brewing beverages, and/or various industrial process needs, such as separating crude oil from water or ethanol distillation.

Figure 18:
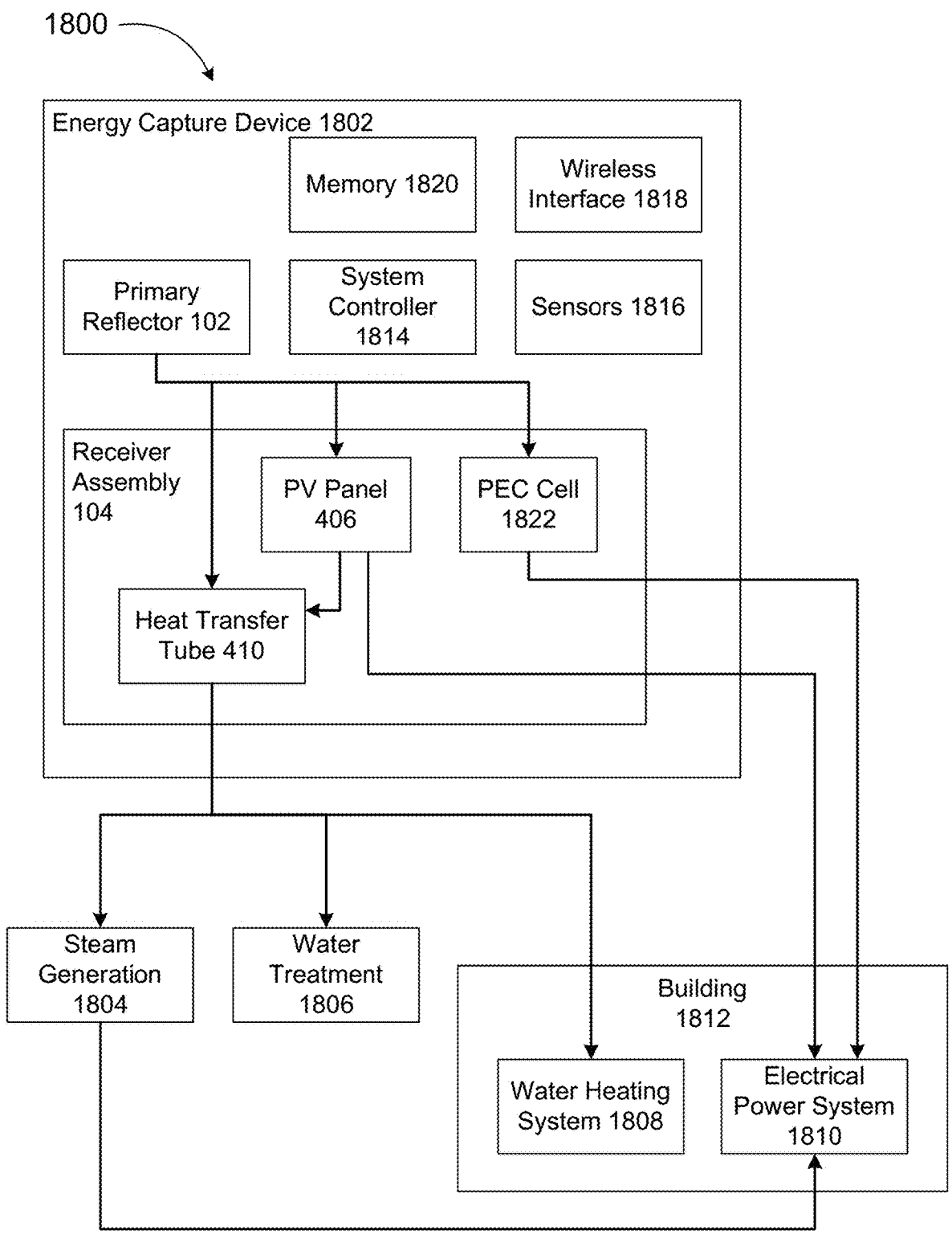
FIG. 18 illustrates an example energy collection system that can be implemented using various embodiments of the present disclosure.

FIG. 18 illustrates an example energy collection system 1800, in accordance with one or more embodiments. Although, as described herein, system 1800 will refer to solar collector 100 and corresponding components, it should be understood that system 1800 may comprise any combination of solar collectors described herein, including solar collectors 1000 and 1300, and analogous corresponding components. According to various embodiments, system 1800 may comprise an energy capture device 1802. In some embodiments energy capture device 1802 may be solar collector 100, which reflects sun sunlight from a primary reflector 102 upon a receiver assembly 104 to generate electricity and/or heat energy. As depicted in FIG. 10, light reflected from primary reflector 102 may be focused onto a heat transfer tube 410 and/or a photovoltaic panel 406 of receiver assembly 104. In some embodiments, heat transfer tube 410 may be heat transfer tube 610 in receiver assembly 104-C, which does not include any PV panels 406.

System 1800 may further comprise system controller 1814, sensors 1816, wireless interface 1818, and memory 1820. In various embodiments, sensors 1816 may include a light source detector, GPS or other geolocation device. In various embodiments, wireless interface 1818 may retrieve and/or receive data, from global databases over a global network, pertaining to relevant astronomical data, location data, and/or time data. In other embodiments, such data may be locally stored in memory 1820. In other embodiments wireless interface 1818 may wirelessly receive user input including instructions for adjusting the translation of receivers 104, the rotation of primary reflectors 102, and/or the tilt of primary reflectors 102. In various embodiments, system controller 1814 utilizes the information gathered by sensors 1816, wireless interface 1818, and memory 1820 to control the various movements of solar collector 100 to optimize light reflection.

Light focused onto photovoltaic panel 406 may then be converted into electrical energy by photovoltaic cells included in the photovoltaic panel 406. Such electrical energy may be transferred to the electrical power system 1810 of a building 1812, which may be residential or commercial. Light focused onto heat transfer tube 410 may be utilized to heat a heat transfer fluid, such as water or antifreeze. The heated heat transfer fluid may then be used to heat water at a water heating system 1808 for a building structure 1812. In some embodiments, energy capture device 1802 may be installed in building 1812, such as on the roof, or on land surrounding building 1812. In further embodiments, the heat transfer fluid may be used for water treatment 1806 and/or steam generation 1804. In some embodiments, all of the various processes may be performed by using a heat transfer fluid comprising glycol or other oil that is heated by solar collector 102, which can then be sent to a heat exchanger to heat the appropriate fluid for the particular process.

Steam generated by steam generation 1804 may be further used to generate electrical power for power system 1810. In various other embodiments, heat captured by energy capture device may be utilized for any of various processes that utilize heat. In various embodiments, the energy collection system 1800 may include one or more solar collectors 100, 1000, and/or 1300. The amount of solar collectors included may depend on the peak output of water of building 1812, desired use, and location. For example, the solar collector 100 as shown in FIG. 1 may generate 2.7 kW of electricity at peak output and 240 gal/day of 70° C. water. An average sized large hotel may require about seven solar collectors 100. A large restaurant may use one. Many more them in a very large application like a large water desalination system.

In some embodiments, light focused from reflectors may be used for driving chemical reactions. For example, sunlight may be used to split water into hydrogen molecules and oxygen molecules. As another example, sunlight may be used to make water and carbon dioxide into hydrocarbon fuels. A leading technology to do this may utilize photo electrochemical (PEC) cells. For example, concentrated sunlight reflected from primary reflector 102 may be directed toward PEC cells 1822 in a reflector assembly 104. Thus, disclosed systems may be an ideal approach as an architecture for such chemical systems. One advantage is fixed piping, such as piping system 1012. In such chemical systems, piping structures may be used to transport hydrogen and/or other strong acids, which may be difficult to seal from leaks and which may require expensive materials for piping. Fixed piping structures may also eliminate and/or reduce the risks associated with transporting such hazardous materials. Another advantage is that the receiver is fixed in place. In some embodiments, bubbles may be generated in the receiver from the chemical reactions. Keeping the receiver structure oriented the same way relative to gravity is important allowing control of the movement of gas bubbles which may evolve during chemical reactions within the PEC cell 1822 and/or piping system 1012. Furthermore, concentrating light allows for much less piping and reactor volume, decreasing safety risks, as well as required physical space.

FIG. 19 is a block diagram illustrating an example of a system 1900 capable of implementing various processes described in the present disclosure. In some embodiments, system 1900 may be an energy capture device 1802, such as solar collector 100, 1000, and/or 1300. In some embodiments, system 1900 may represent system controller 1014. According to particular embodiments, a system 1900, suitable for implementing particular embodiments of the present disclosure, includes a processor 1901, a memory 1903, an interface 1911, and a bus 1915 (e.g., a PCI bus or other interconnection fabric) and operates as a streaming server. In some embodiments, when acting under the control of appropriate software or firmware, the processor 1901 is responsible for processing sensor data, geolocation data, astronomical data, and/or time data to determine optimal positioning of various components of solar collector 100. In other embodiments, processor 1901 may also control signals from one or more control systems of various processes described with reference to FIG. 18, including steam generation 1804, water treatment 1806, water heating system 1808, and/or electrical power system 1810. In some embodiments, processor 1901 may receive and process signals from an inverter which converts the DC power of the photovoltaic cells to AC power for use in the grid. In other embodiments, the processor 1901 is responsible for receiving such relevant information from one or more databases. Various specially configured devices can also be used in place of a processor 1901 or in addition to processor 1901.

The interface 1911 is typically configured to send and receive data packets or data segments over a network, such as the Internet. Interface 1911 may also be configured to communicate with and control various device elements and components, such as actuators for moving the elements and components solar collector 100, as described with reference to FIGS. 9A and 9B, and/or elements and components of solar collectors 1000 and/or 1300, as described with reference to FIGS. 17A and 17B. Particular examples of interfaces supports include Ethernet interfaces, frame relay interfaces, cable interfaces, DSL interfaces, token ring interfaces, and the like. In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management.

According to particular example embodiments, the system 1900 uses memory 1903 to store data and program instructions for operations including determining optimal rotation position for primary reflectors (such as 102, 1002, and/or 1302), determining optimal translation distance for receivers (such as 104, 1004, and/or 1304), determining optimal tilt angle for primary reflectors (such as 102. 1002, and/or 1302), and/or controlling various device elements and components. The program instructions may control the operation of an operating system and/or one or more applications, for example. In some embodiments, memory 1903 is memory 1820.

Because such information and program instructions may be employed to implement the systems/techniques described herein, the present disclosure relates to tangible, or non-transitory, machine readable media that include program instructions, state information, etc. for performing various operations described herein. Examples of machine-readable media include hard disks, floppy disks, magnetic tape, optical media such as CD-ROM disks and DVDs; magneto-optical media such as optical disks, and hardware devices that are specially configured to store and perform program instructions, such as read-only memory devices (ROM) and programmable read-only memory devices (PROMs). Examples of program instructions include both machine code, such as produced by a compiler, and files containing higher level code that may be executed by the computer using an interpreter.

Although many of the components and processes are described above in the singular for convenience, it will be appreciated by one of skill in the art that multiple components and repeated processes can also be used to practice the techniques of the present disclosure.

While the present disclosure has been particularly shown and described with reference to specific embodiments thereof, it will be understood by those skilled in the art that changes in the form and details of the disclosed embodiments may be made without departing from the spirit or scope of the disclosure. It is therefore intended that the disclosure be interpreted to include all variations and equivalents that fall within the true spirit and scope of the present disclosure.

What is claimed is:

1. A solar collector device comprising:
a receiver assembly mounted on a frame structure, the receiver assembly comprising a plurality of receivers, each receiver including a longitudinal axis, wherein the longitudinal axes of the plurality of receivers define a first plane; and
a plurality of primary reflectors, each primary reflector corresponding to a different respective receiver of the plurality of receivers, wherein each primary reflector comprises an elongated curved mirror, a pivot arm extending behind the primary reflector opposite the elongated curved mirror, and a rotation axis that is fixed and located within the pivot arm positioned at a point behind the primary reflector;
wherein each pivot arm is rotatably coupled to the frame structure such that the respective primary reflector may rotate about the respective rotation axis, wherein the rotation axis of each primary reflector and the longitudinal axis of the respective corresponding receiver form a second plane that is fixed and remains perpendicular to the first plane;
wherein each primary reflector includes a same angle of rotation relative to the respective corresponding receiver; and
wherein each primary reflector reflects light focused upon the respective corresponding receiver.

2. The solar collector device of claim 1, wherein the solar collector device is positioned such that the rotation axis of each primary reflector is aligned from north to south, wherein the plurality of primary reflectors is tilted toward Earth's equator.

3. The solar collector device of claim 1, further comprising:
a connecting rod coupled to each primary reflector; and
an actuator coupled to the connecting rod, wherein the actuator and connecting rod are configured to cause synchronous rotation of the primary reflectors about the respective rotation axis such that each primary reflector includes the same angle of rotation relative to the respective corresponding receiver.

4. The solar collector device of claim 1, wherein each primary reflector and each receiver assembly are approximately equal in length.

5. The solar collector device of claim 4, wherein the receiver assembly translates along the frame structure in a direction that is parallel to the rotation axes of the plurality of primary reflectors.

6. The solar collector device of claim 3, wherein the plurality of primary reflectors are mounted on a carriage system including a plurality of travelers, each traveler slidably coupled to a respective rail structure located on the frame structure, wherein the carriage system is configured to slide upon the rail structures to translate the plurality of primary reflectors along the frame structure in a direction that is parallel to the rotation axes of the plurality of primary reflectors.

7. The solar collector device of claim 1, wherein the receiver assembly further comprises:
a heat transfer tube positioned at each receiver; and
a photovoltaic panel coupled to each heat transfer tube by a conductive plate.

8. The solar collector device of claim 7, wherein each conductive plate and each heat transfer tube are enclosed in a thermally insular material.

9. The solar collector device of claim 1, wherein a heat transfer tube is positioned at a center of each receiver of the receiver assembly, and wherein one or more secondary concentrators are positioned around each heat transfer tube opposite the respective corresponding primary reflector.

10. The solar collector device of claim 3, wherein the actuator and connecting rod are configured to generate a linear force in a direction that is perpendicular to the rotation axes of the plurality of primary reflectors.

11. A method comprising:
rotating each of a plurality of primary reflectors around a respective rotation axis, wherein each primary reflector comprises an elongated curved mirror and a pivot arm extending behind the primary reflector opposite the elongated curved mirror, wherein the rotation axis of each primary reflector is fixed and located within the respective pivot arm positioned at a point behind the primary reflector, wherein each pivot arm is rotatably coupled to a frame structure; and
reflecting light focused from the plurality of primary reflectors upon a receiver assembly mounted on the frame structure, the receiver assembly comprising a plurality of receivers, each primary reflector corresponding to a different respective receiver of the plurality of receivers such that each primary reflector reflects light focused upon the respective corresponding receiver;
wherein each receiver includes a longitudinal axis, wherein the longitudinal axes of the plurality of receivers define a first plane, wherein the rotation axis of each primary reflector and the longitudinal axis of the respective corresponding receiver form a second plane that is fixed and remains perpendicular to the first plane; and
wherein each primary reflector includes a same angle of rotation relative to the respective corresponding receiver.

12. The method of claim 11, further comprising:
positioning the frame structure such that the rotation axis of each primary reflector is aligned from north to south; and
tilting each primary reflector toward Earth's equator.

13. The method of claim 11, further comprising:
translating the receiver assembly along the frame structure in a direction that is parallel to the rotation axes of the plurality of primary reflectors.

14. The method of claim 11, further comprising:
translating the plurality of primary reflectors along the frame structure in a direction that is parallel to the rotation axes of the plurality of primary reflectors.

15. The method of claim 11, wherein the receiver assembly further comprises:
a heat transfer tube positioned at each receiver; and
a photovoltaic panel coupled to each heat transfer tube by a conductive plate.

16. The method of claim 15, wherein each conductive plate and each heat transfer tube are enclosed in a thermally insular material.

17. The method of claim 11, wherein a heat transfer tube is positioned at a center of each receiver of the receiver assembly and wherein one or more secondary concentrators are positioned around each heat transfer tube opposite the respective corresponding primary reflector.

18. A system comprising:
a water heating system; and
a solar collector device comprising:
  a receiver assembly mounted on a frame structure, the receiver assembly comprising:
    a plurality of receivers, each receiver including a longitudinal axis, wherein the longitudinal axes of the plurality of receivers define a first plane;
    a heat transfer tube coupled to the water heating system; and
  a plurality of primary reflectors, each primary reflector corresponding to a different respective receiver of the plurality of receivers, wherein each primary reflector comprises an elongated curved mirror, a pivot arm extending behind the primary reflector opposite the elongated curved mirror, and a rotation axis that is fixed and located within the pivot arm positioned at a point behind the primary reflector;
  wherein each pivot arm is rotatably coupled to the frame structure such that the respective primary reflector may rotate about the rotation axis, wherein the rotation axis of each primary reflector and the longitudinal axis of the respective corresponding receiver form a second plane that is fixed and remains perpendicular to the first plane;
  wherein each primary reflector includes a same angle of rotation relative to the respective corresponding receiver; and
  wherein each primary reflector reflects light focused upon the respective corresponding receiver.

19. The solar collector device of claim 1,
  wherein each primary reflector is defined by a first curved edge and a second curved edge such that the elongated curved mirror of each primary reflector extends from the respective first curved edge to the respective second curved edge,
  wherein each pivot arm of a respective primary reflector is located between and at a distance from the respective first curved edge and the respective second curved edge.

20. The solar collector device of claim 19, wherein each receiver is positioned outside of a boundary defined by the first curved edge and the second curved edge of the respective corresponding primary reflector.

* * * * *